United States Patent
Kato et al.

(10) Patent No.: US 11,597,137 B2
(45) Date of Patent: Mar. 7, 2023

(54) METHOD OF FORMING PATTERN OF CURED PRODUCT AS WELL AS PRODUCTION METHODS FOR PROCESSED SUBSTRATE, OPTICAL COMPONENT, CIRCUIT BOARD, ELECTRONIC COMPONENT, IMPRINT MOLD AND IMPRINT PRETREATMENT COATING MATERIAL

(71) Applicant: CANON KABUSHIKI KAISHA, Tokyo (JP)

(72) Inventors: Jun Kato, Utsunomiya (JP); Takeshi Honma, Tokyo (JP); Toshiki Ito, Kawasaki (JP); Hidetoshi Tsuzuki, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 718 days.

(21) Appl. No.: 16/150,939

(22) Filed: Oct. 3, 2018

(65) Prior Publication Data
US 2019/0030785 A1    Jan. 31, 2019

Related U.S. Application Data

(63) Continuation of application No. PCT/JP2017/013501, filed on Mar. 31, 2017.
(Continued)

(51) Int. Cl.
*B29C 59/16*    (2006.01)
*G03F 7/00*    (2006.01)
(Continued)

(52) U.S. Cl.
CPC ............ *B29C 59/16* (2013.01); *B29C 59/002* (2013.01); *B29C 59/007* (2013.01);
(Continued)

(58) Field of Classification Search
CPC ..... G03F 7/161; G03F 7/0002; B29C 59/026; B29C 2059/023; B82Y 40/00
See application file for complete search history.

(56) References Cited

U.S. PATENT DOCUMENTS 8,329,089 B2    12/2012    Kim et al.
8,541,591 B2    9/2013    Kato et al.
(Continued)

FOREIGN PATENT DOCUMENTS

CN    101063816 A    10/2007
CN    102460644 A    5/2012
(Continued)

OTHER PUBLICATIONS

Notification of Reason for Refusal in Korean Application No. 10-2018-7031604 (dated Jan. 2020).
(Continued)

*Primary Examiner* — Xiao S Zhao
*Assistant Examiner* — John J DeRusso
(74) *Attorney, Agent, or Firm* — Venable LLP

(57) ABSTRACT

Provided is a method of producing a cured product pattern, including: a first step (arranging step) of arranging a layer formed of a curable composition ($\alpha1'$) that is the components of the curable composition ($\alpha1$) except the component (D) serving as a solvent on a substrate; and a second step (applying step) of applying droplets of a curable composition ($\alpha2$) discretely onto the layer formed of the curable composition ($\alpha1$), the curable composition ($\alpha1$) having a number concentration of particles each having a particle diameter of 0.07 μm or more of less than 2,021 particles/mL, and the curable composition ($\alpha1'$) having a surface tension larger than that of the curable composition ($\alpha2$).

11 Claims, 5 Drawing Sheets

Related U.S. Application Data

(60) Provisional application No. 62/319,878, filed on Apr. 8, 2016.

(51) Int. Cl.

| | | |
|---|---|---|
| *G03F 7/16* | (2006.01) | |
| *B29C 59/00* | (2006.01) | |
| *H01L 21/02* | (2006.01) | |
| *H01L 21/027* | (2006.01) | |
| *B82Y 10/00* | (2011.01) | |
| *B82Y 40/00* | (2011.01) | |
| *G03F 7/027* | (2006.01) | |
| *B29K 33/00* | (2006.01) | |

(52) U.S. Cl.
CPC ............ *G03F 7/0002* (2013.01); *G03F 7/027* (2013.01); *G03F 7/161* (2013.01); *H01L 21/022* (2013.01); *H01L 21/0273* (2013.01); *B29C 2791/005* (2013.01); *B29K 2033/12* (2013.01); *B82Y 10/00* (2013.01); *B82Y 40/00* (2013.01)

(56) References Cited

U.S. PATENT DOCUMENTS

| | | | |
|---|---|---|---|
| 9,138,936 B2 | 9/2015 | Kita et al. | |
| 9,541,826 B2 | 1/2017 | Ito et al. | |
| 9,623,439 B2 | 4/2017 | Ito et al. | |
| 9,796,803 B2 | 10/2017 | Kitagawa et al. | |
| 10,023,673 B2 | 7/2018 | Kato et al. | |
| 10,095,106 B2 | 10/2018 | Stachowiak et al. | |
| 10,293,543 B2 | 5/2019 | Honma et al. | |
| RE47,456 E * | 6/2019 | Kobayashi | B82Y 10/00 |
| 10,754,243 B2 * | 8/2020 | Ito | C09D 133/06 |
| 10,754,244 B2 * | 8/2020 | Ito | C09D 133/06 |
| 10,754,245 B2 * | 8/2020 | Ito | C09D 133/06 |
| 10,829,644 B2 * | 11/2020 | Otani | G03F 7/162 |
| 10,845,700 B2 * | 11/2020 | Chiba | G03F 7/0002 |
| 10,883,006 B2 * | 1/2021 | Chiba | B29C 35/0805 |
| 10,935,884 B2 * | 3/2021 | Chiba | H01L 21/0271 |
| 11,037,785 B2 * | 6/2021 | Kato | G03F 7/094 |
| 11,126,078 B2 * | 9/2021 | Ito | C08F 122/1006 |
| 2009/0085255 A1 | 4/2009 | Tada | G11B 5/855 264/401 |
| 2010/0270712 A1 * | 10/2010 | Ishii | G03F 7/0002 264/496 |
| 2011/0156322 A1 | 6/2011 | Tokue | |
| 2011/0195189 A1 | 8/2011 | Kawamura | |
| 2012/0080826 A1 | 4/2012 | Saito | |
| 2015/0014819 A1 | 1/2015 | Hattori et al. | |
| 2015/0075855 A1 | 3/2015 | Ito et al. | |
| 2015/0368433 A1 | 12/2015 | Kitagawa et al. | |
| 2016/0009945 A1 | 1/2016 | Enomoto et al. | |
| 2016/0160003 A1 | 6/2016 | Kitagawa et al. | |
| 2016/0187774 A1 | 6/2016 | Ito et al. | |
| 2017/0066208 A1 | 3/2017 | Khusnatdinov et al. | |
| 2017/0068159 A1 | 3/2017 | Khusnatdinov et al. | |
| 2017/0068161 A1 | 3/2017 | Stachowiak et al. | |
| 2017/0282440 A1 | 10/2017 | Stachowiak et al. | |
| 2017/0283620 A1 | 10/2017 | Otani et al. | |
| 2017/0283632 A1 | 10/2017 | Chiba et al. | |
| 2017/0285462 A1 | 10/2017 | Ito et al. | |
| 2017/0285463 A1 | 10/2017 | Ito et al. | |
| 2017/0285464 A1 | 10/2017 | Ito et al. | |
| 2017/0285465 A1 | 10/2017 | Iimura et al. | |
| 2017/0285466 A1 | 10/2017 | Chiba et al. | |
| 2017/0285479 A1 | 10/2017 | Stachowiak et al. | |
| 2017/0287708 A1 | 10/2017 | Liu et al. | |
| 2017/0371240 A1 | 12/2017 | Liu et al. | |
| 2018/0252999 A1 | 9/2018 | Stachowiak et al. | |
| 2018/0272634 A1 | 9/2018 | Khusnatdinov et al. | |
| 2018/0275511 A1 | 9/2018 | Stachowiak et al. | |
| 2018/0291130 A1 | 10/2018 | Kato et al. | |
| 2019/0004421 A1 * | 1/2019 | Ito | C08F 122/1006 |
| 2019/0377260 A1 * | 12/2019 | Otani | H01L 21/027 |
| 2020/0166836 A1 * | 5/2020 | Saito | C08F 2/50 |

FOREIGN PATENT DOCUMENTS

| | | |
|---|---|---|
| CN | 103124623 A | 5/2013 |
| CN | 104246976 A | 12/2014 |
| CN | 105340062 A | 2/2016 |
| JP | 2010-073811 A | 4/2010 |
| JP | 2011-165855 A | 8/2011 |
| JP | 2013-202982 A | 10/2013 |
| JP | 2014-24322 A | 2/2014 |
| JP | 2015-41742 A | 3/2015 |
| JP | 2016-29138 A | 3/2016 |
| TW | 201439181 A | 10/2014 |
| WO | 2017/130853 A1 | 8/2017 |
| WO | 2017/175668 A1 | 10/2017 |

OTHER PUBLICATIONS

Shravanthi Reddy et al., "Simulation of Fluid Flow in the Step and Flash Imprint Lithography Process," 82 Microelectron. Eng. 60-70 (Jul. 2005).

Nobuyuki Imaishi, "Fundamental of the Marangoni Convection," 31 Int. J. Microgravity Sci., Supplement S5-S12 (2014).

International Search Report in International Application No. PCT/JP2017/013501 (dated Jun. 2017).

International Preliminary Report on Patentability in International Application No. PCT/JP2017/013501 (dated Oct. 2018).

Office Action in Taiwanese Application No. 106111568 (dated Nov. 2017).

First Office Action in Chinese Application No. 201780022394.2 (dated Sep. 2022).

* cited by examiner

STEP(1)

STEP(2)

STEP(3)

STEP(4)

STEP(1)

STEP(2)

STEP(3)

STEP(4)

STEP(5)

STEP(5)

STEP(6)

STEP(7)

METHOD OF FORMING PATTERN OF CURED PRODUCT AS WELL AS PRODUCTION METHODS FOR PROCESSED SUBSTRATE, OPTICAL COMPONENT, CIRCUIT BOARD, ELECTRONIC COMPONENT, IMPRINT MOLD AND IMPRINT PRETREATMENT COATING MATERIAL

CROSS-REFERENCE TO RELATED APPLICATIONS

This application is a Continuation of International Patent Application No. PCT/JP2017/013501, filed Mar. 31, 2017, which claims the benefit of U.S. Provisional Patent Application No. 62/319,878, filed Apr. 8, 2016, both of which are hereby incorporated by reference herein in their entirety.

BACKGROUND OF THE INVENTION

Field of the Invention

The present invention relates to a method of forming a cured product pattern, a method of producing a processed substrate, a method of producing an optical component, a method of producing a circuit board, a method of producing an electronic component, a method of producing an imprint mold, and a material for an imprint pretreatment coating.

Description of the Related Art

There has been a growing requirement for miniaturization in a semiconductor device, a MEMS, or the like, and a photo-nanoimprint technology has particularly been attracting attention.

In the photo-nanoimprint technology, a photocurable composition (resist) is cured in a state in which a mold having a fine groove/land pattern formed on its surface is pressed against a substrate (wafer) having applied thereto the resist. Thus, the groove/land pattern of the mold is transferred onto the cured product of the resist and hence the pattern is formed on the substrate. According to the photo-nanoimprint technology, a fine structural body of the order of several nanometers can be formed on the substrate.

In the photo-nanoimprint technology, first, a resist is applied to a pattern formation region on a substrate (arranging step). Next, the resist is molded with a mold having formed thereon a pattern (mold contacting step). Then, the resist is cured by being irradiated with light (light irradiating step), and the cured resist is released (releasing step). The performance of those steps forms the pattern of a resin having a predetermined shape (photocured product) on the substrate. Further, the repetition of all the steps at any other position on the substrate can form a fine structural body on the entirety of the substrate.

A photo-nanoimprint technology disclosed in Japanese Patent Application Laid-Open No. 2010-073811 is described with reference to FIGS. 1A through 1F (including 1DA and 1FA). First, a liquid resist 102 is dispensed dropwise discretely onto a pattern formation region on a substrate 101 by using an inkjet method (arranging step (1), FIGS. 1A through 1C). Droplets 102 of the resist dispensed dropwise spread on the substrate 101 as indicated by arrows 104 showing the direction in which droplets spread, and the phenomenon is called prespread (FIG. 1C). Next, the resist 102 is molded with a mold 105 that has a pattern formed thereon and is transparent to irradiation light 106 to be described later (mold contacting step (2), FIGS. 1D and 1DA). In the mold contacting step, the droplets of the resist 102 spread over the entire region of a gap between the substrate and the mold by virtue of a capillary phenomenon as indicated by the arrows 104 showing the direction in which droplets spread (FIGS. 1D and 1DA). The phenomenon is called spread. In addition, in the mold contacting step, the resist 102 is filled into a groove portion on the mold 105 as indicated by the arrows 104 showing the direction in which droplets spread by the capillary phenomenon (FIG. 1DA). The filling phenomenon is called fill. A time period required for the spread and the fill to be completed is called a filling time. After the completion of the filling of the resist 102, the resist 102 is cured by being irradiated with irradiation light 106 (light irradiating step (3), FIG. 1E), and then the mold 105 is released from the substrate 101 (releasing step (4), FIG. 1F). The performance of those steps in the stated order results in the formation of a pattern of the cured resist 102 having a predetermined shape (photocured film 107, FIGS. 1F and 1FA) on the substrate 101. A remaining film 108 may remain in a groove portion of the resist pattern corresponding to a land portion of the mold 105 (FIG. 1FA).

The photo-nanoimprint technology disclosed in Japanese Patent Application Laid-Open No. 2010-073811 has involved a problem in that a time period (filling time) from the initiation of the contact of the mold to the completion of the spread and the fill is long, and hence throughput is low.

SUMMARY OF THE INVENTION

In view of the foregoing, the inventors of the present invention have devised a photo-nanoimprint technology having a short filling time, in other words, high throughput (short spread time nanoimprint lithography, hereinafter referred to as "SST-NIL"). As illustrated in the schematic sectional views of FIGS. 2A through 2G the SST-NIL includes:

an arranging step (1) of arranging a liquid film of a curable composition ($\alpha1$) 202 on a substrate 201;

an applying step (2) of applying droplets of a curable composition ($\alpha2$) 203 discretely onto the layer formed of the liquid film of the curable composition ($\alpha1$) 202;

a mold contacting step (3) of bringing a mixture layer obtained by partially mixing the curable composition ($\alpha1$) 202 and the curable composition ($\alpha2$) 203 into contact with a mold 205;

a light irradiating step (4) of curing the mixture layer obtained by mixing the two kinds of curable compositions by irradiation light 206; and a releasing step (5) of releasing the mold from the mixture layer 207 after the curing.

In the SST-NIL, a series of step units ranging from the applying step (2) to the releasing step (5) is referred to as "shot", and a region where the mold 205 is in contact with the curable compositions ($\alpha1$) 202 and the curable compositions ($\alpha2$) 203, in other words, a region where a pattern is formed on the substrate 201 is referred to as "shot region".

In the SST-NIL, the droplets of the curable composition ($\alpha2$) 203 dispensed dropwise discretely expand quickly on the liquid film of the curable composition ($\alpha1$) 202 as indicated by arrows 204 showing the direction in which droplets spread, and hence a filling time is short and throughput is high. A detailed mechanism for the SST-NIL is described later.

In the SST-NIL process, pattern transfer and molding are performed by bringing the mixture layer obtained by partially mixing the curable composition ($\alpha1$) and the curable composition (α2) on the substrate into contact with the mold. Accordingly, when foreign matter having a size equal to or more than a certain size is present in each of the curable composition (α1) to be arranged on the substrate in the arranging step and the curable composition (α2) to be applied onto the layer of the curable composition (α1) in the applying step, the breakage or clogging of the groove/land pattern of the mold occurs.

Particularly in the case where the pattern transfer on the substrate, and the curing of the mixture layer obtained by mixing the curable composition (α1) and the curable composition (α2) are repeated with one mold a plurality of times, when the breakage or clogging of the groove/land pattern of the mold occurs in the course of the repetition, inconveniences occur in all subsequent transfer patterns. As a result, there arises a problem in that a yield (throughput) significantly reduces.

Accordingly, in view of the problem, an object of the present invention is to improve the yield (throughput) of the SST-NIL process.

A method of producing a cured product pattern according to one embodiment of the present invention includes:

(1) a first step (arranging step) of arranging a layer formed of a liquid film of a curable composition (α1) on a substrate;

(2) a second step (applying step) of applying droplets of a curable composition (α2) discretely onto the layer formed of the liquid film of the curable composition (α1') that is the components of the curable composition (α1) except the component (D) serving as a solvent;

(3) a third step (mold contacting step) of bringing a mixture layer obtained by partially mixing the curable composition (α1') and the curable composition (α2) into contact with a mold having a pattern;

(4) a fourth step (light irradiating step) of irradiating the mixture layer with light from the outside of the mold to cure the layer; and (5) a fifth step (releasing step) of releasing the mold from the mixture layer after the curing, the curable composition (α1) having a number concentration of particles each having a particle diameter of 0.07 µm or more of less than 2,021 particles/mL, and the curable composition (α1') having a surface tension larger than that of the curable composition (α2).

A material for an imprint pretreatment coating of the present invention consists a curable composition (α1), the material being configured to form a liquid film of the curable composition (α1) serving as a pretreatment coating on a substrate and to promote, at a time of application of a droplet formed of a curable composition (α2) to the liquid film, spread of a component of the droplet in a substrate surface direction, in which the curable composition (α1') that is the components of the curable composition (α1) except the component (D) serving as a solvent has a surface tension larger than that of the curable composition (α2), and the curable composition (α1) has a number concentration of particles each having a particle diameter of 0.07 µm or more of less than 2,021 particles/mL.

According to the present invention, the yield (throughput) of the imprint process can be improved.

Further features of the present invention will become apparent from the following description of exemplary embodiments with reference to the attached drawings.

DESCRIPTION OF THE EMBODIMENTS

Figure 1A:
FIGS. 1A, 1B, 1C, 1D, 1DA, 1E, 1F, and 1FA are schematic sectional views for illustrating a precedent for a photo-nanoimprint technology.
Figure 1B:
Figure 1C:
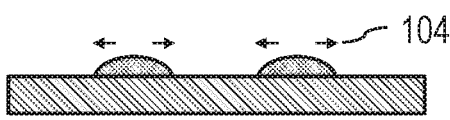
Figure 1D:
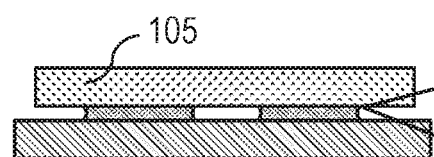
Figure 1D:
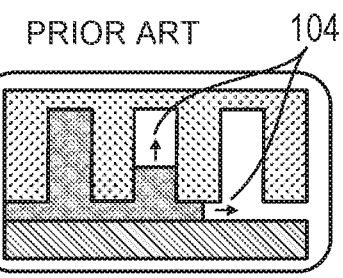
Figure 1E:
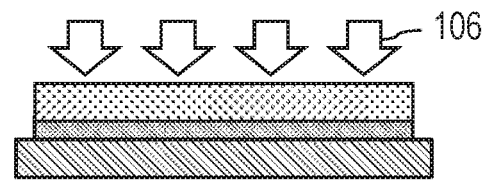
Figure 1F:
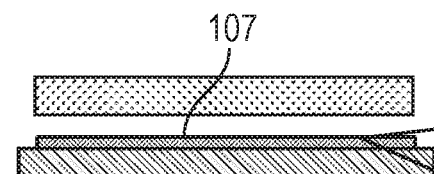
Figure 1F:
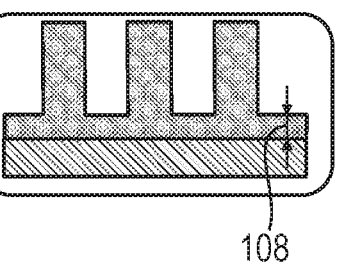

An embodiment of the present invention is described in detail below with reference to the drawings as appropriate. However, the present invention is not limited to the embodiment to be described below. Appropriate modifications, improvements, and the like of the embodiment to be described below that do not deviate from the gist of the present invention and are based on the ordinary knowledge of a person skilled in the art are also included in the scope of the present invention.

[Curable Composition (α1)]

A material for an imprint pretreatment coating according to this embodiment contains a curable composition (α1). Preferably, the material for the imprint pretreatment coating according to this embodiment consists of the curable composition (α1).

The material for an imprint pretreatment coating is configured to form a liquid film serving as a pretreatment coating on a substrate and to promote the spread of a droplet component in a substrate surface direction through the application of a droplet to the liquid film.

The curable composition (α1) is characterized in that: the composition has a number concentration of particles each having a particle diameter of 0.07 µm or more of less than 2,021 particles/mL; and the composition has a surface tension larger than that of the droplet to be applied, i.e., a curable composition (α2) to be arranged on the liquid film.

In addition, the term "cured product" as used herein means a product obtained by polymerizing a polymerizable compound in a composition such as a curable composition, to cure part or the entirety of the composition. When emphasis is placed on the fact that the thickness of a cured product of interest is extremely thin as compared to its area, the cured product is particularly described as "cured film" in some cases. In addition, when emphasis is placed on the fact that a cured product of interest is laid in a layer manner, the cured product is particularly described as "cured layer" in some cases. The shape of such "cured product," "cured film," or "cured layer" is not particularly limited, and the cured product, the cured film, or the cured layer may have a pattern shape on its surface.

Respective components according to this embodiment are described in detail below.

(Curable Compositions (α): Curable Composition (α1) and Curable Composition (α2))

In this embodiment, curable compositions (α), i.e., the curable composition (α1) and the curable composition (α2) are each a compound containing at least a component (A) serving as a polymerizable compound. In this embodiment, the curable compositions (α) may each further contain a component (B) serving as a photopolymerization initiator, a component (C) serving as a non-polymerizable compound, or a component (D) serving as a solvent. However, the curable compositions (α) are not limited thereto as long as the compositions are cured by being irradiated with light. For example, the curable compositions (α) may each contain a compound having reactive functional groups functioning as the component (A) and the component (B) in the same molecule.

The respective components of the curable compositions (α) are described in detail below.

<Component (A): Polymerizable Compound>

The component (A) is a polymerizable compound. The polymerizable compound in this embodiment is a component that reacts with a polymerizing factor (e.g., a radical) generated from the component (B) serving as the photopolymerization initiator to polymerize through a chain reaction (polymerization reaction). The polymerizable compound is preferably a compound that forms a cured product formed of a polymer compound through the chain reaction.

In this embodiment, it is preferred that all polymerizable compounds in each of the curable compositions (α) be collectively regarded as the component (A). This case includes: a construction in which each of the curable compositions (α) contains only one kind of polymerizable compound in itself; and a construction in which the composition contains only a plurality of kinds of specific polymerizable compounds in itself.

Such polymerizable compound is, for example, a radical polymerizable compound. The polymerizable compound according to this embodiment is more preferably the radical polymerizable compound from the viewpoints of a polymerization rate, a curing rate, and the shortening of, for example, a time period for each step.

The radical polymerizable compound is preferably a compound having one or more acryloyl groups or methacryloyl groups, i.e., a (meth)acrylic compound.

Therefore, in this embodiment, it is preferred that the (meth)acrylic compound be incorporated as the component (A) of each of the curable compositions (α). In addition, it is more preferred that a main component for the component (A) be the (meth)acrylic compound, and it is most preferred that the entirety of the polymerizable compound in each of the curable compositions (α) be the (meth)acrylic compound. The phrase "a main component for the component (A) is the (meth)acrylic compound" described herein means that the (meth)acrylic compound accounts for 90 wt % or more of the component (A).

When the radical polymerizable compound includes a plurality of kinds of (meth)acrylic compounds, the compound preferably contains a monofunctional (meth)acrylic monomer and a polyfunctional (meth)acrylic monomer. This is because the combination of the monofunctional (meth)acrylic monomer and the polyfunctional (meth)acrylic monomer provides a cured product having a high mechanical strength.

Monofunctional (meth)acrylic compounds having one acryloyl group or methacryloyl group are exemplified by, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, 1-naphthylmethyl (meth)acrylate, 2-naphthylmethyl (meth)acrylate, tetrahydrofurfuryl (meth)acrylate, butoxyethyl (meth)acrylate, ethoxy diethylene glycol (meth)acrylate, polyethylene glycol mono (meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethyl aminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products corresponding to the monofunctional (meth)acrylic compounds include, but not limited to: Aronix M101, M102, M110, M111, M113, M117, M5700, TO-1317, M120, M150, and M156 (all of which are manufactured by Toagosei Co., Ltd); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of which are manufactured by Osaka Organic Chemical Industry Ltd.); Light Acrylate BO-A, EC-A, DMP-A, THF-A, HOP-A, HOA-MPE, HOA-MPL, PO-A, P-200A, NP-4EA, and NP-8EA, and Epoxy Ester M-600A (all of which are manufactured by Kyoeisha Chemical Co., Ltd.); KAYARAD TC110S, R-564, and R-128H (all of which are manufactured by Nippon Kayaku Co., Ltd.); NK Ester AMP-10G and AMP-20G (both of which are manufactured by Shin-Nakamura Chemical Co., Ltd.); FA-511A, 512A, and 513A (all of which are manufactured by Hitachi Chemical Co., Ltd.); PHE, CEA, PHE-2, PHE-4, BR-31, BR-31M, and BR-32 (all of which are manufactured by Dai-ichi Kogyo Seiyaku Co., Ltd.); VP (manufactured by BASF); and ACMO, DMAA, and DMAPAA (all of which are manufactured by Kohjin Co., Ltd.).

Polyfunctional (meth)acrylic compounds having two or more acryloyl groups or methacryloyl groups are exemplified by, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, phenylethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,12-dodecanediol diacrylate, 1,3-adamantane dimethanol di(meth)acrylate, o-xylylene di(meth)acrylate, m-xylylene di(meth)acrylate, p-xylylene di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl) propane, PO-modified 2,2-bis(4-((meth)acryloxy)phenyl) propane, and EO,PO-modified 2,2-bis(4-((meth)acryloxy) phenyl)propane.

Examples of commercial products corresponding to the polyfunctional (meth)acrylic compounds include, but not limited to: Upimer UV SA1002 and SA2007 (both of which are manufactured by Mitsubishi Chemical Corporation); Viscoat #195, #230, #215, #260, #335HP, #295, #300, #360, #700, GPT, and 3PA (all of which are manufactured by Osaka Organic Chemical Industry Ltd.); Light Acrylate 4EG-A, 9EG-A, NP-A, DCP-A, BP-4EA, BP-4PA, TMP-A, PE-3A, PE-4A, and DPE-6A (all of which are manufactured by Kyoeisha Chemical Co., Ltd.); KAYARAD PET-30, TMPTA, R-604, DPHA, DPCA-20, -30, -60, and -120, and HX-620, D-310, and D-330 (all of which are manufactured by Nippon Kayaku Co., Ltd.); Aronix M208, M210, M215, M220, M240, M305, M309, M310, M315, M325, and M400 (all of which are manufactured by Toagosei Co., Ltd); and Lipoxy VR-77, VR-60, and VR-90 (all of which are manufactured by Showa Denko K.K.).

One kind of those radical polymerizable compounds may be used alone, or two or more kinds thereof may be used in combination. In the above-mentioned compound group, the term "(meth)acrylate" means an acrylate or a methacrylate having an alcohol residue equal to the acrylate. The term "(meth)acryloyl group" means an acryloyl group or a methacryloyl group having an alcohol residue equal to the acryloyl group. The abbreviation "EO" refers to ethylene oxide, and the term "EO-modified compound A" means a compound in which a (meth)acrylic acid residue and an alcohol residue of the compound A are bonded to each other through a block structure of an ethylene oxide group. Further, the abbreviation "PO" refers to propylene oxide, and the term "PO-modified compound B" means a compound in which a (meth)acrylic acid residue and an alcohol residue of the compound B are bonded to each other through a block structure of a propylene oxide group.

The blending ratio of the component (A) serving as a polymerizable compound in the curable composition (α1) is desirably 50 wt % or more and 100 wt % or less with respect to the total weight of the component (A), the component (B), and the component (C), i.e., the total weight of the components of the curable composition (α1') that is the components of the curable composition (α1) except the component (D) serving as a solvent. In addition, the blending ratio is preferably 80 wt % or more and 100 wt % or less, more preferably 90 wt % or more and 100 wt % or less.

When the blending ratio of the component (A) serving as a polymerizable compound is set to 50 wt % or more with respect to the total weight of the components of the curable composition (α1'), a cured film to be obtained can be turned into a cured film having some degree of mechanical strength.

The blending ratio of the component (A) serving as a polymerizable compound in the curable composition (α2) is desirably 50 wt % or more and 99.9 wt % or less with respect to the total weight of the component (A), the component (B), and the component (C), i.e., the total weight of the components of the curable composition (α2') that is the components of the curable composition (α2) except the component (D) serving as a solvent. In addition, the blending ratio is preferably 80 wt % or more and 99 wt % or less, more preferably 90 wt % or more and 98 wt % or less.

When the blending ratio of the component (A) serving as a polymerizable compound is set to 50 wt % or more with respect to the total weight of the components of the curable composition (α2'), a cured film to be obtained can be turned into a cured film having some degree of mechanical strength.

In addition, as described below, it is preferred that the curable composition (α1) contain the component (D). The blending ratio of the component (A) is desirably 0.01 wt % or more and 10 wt % or less with respect to the total weight of the components of the curable composition (α1) containing the component (D) serving as a solvent.

<Component (B): Photopolymerization Initiator>

The component (B) is a photopolymerization initiator. The curable compositions (α) according to this embodiment may each further contain the component (B) serving as the polymerization initiator in addition to the component (A) described in the foregoing in accordance with various purposes to the extent that the effects of the present invention are not impaired.

The component (B) may be formed of one kind of polymerization initiator or a plurality of kinds of polymerization initiators.

The photopolymerization initiator is a compound that detects light having a predetermined wavelength to generate the above-mentioned polymerizing factor (e.g., a radical). Specifically, the photopolymerization initiator is a polymerization initiator (radical generator) that generates a radical with light (a radiation, e.g., an infrared ray, a visible ray, an ultraviolet ray, a far ultraviolet ray, an X-ray, or a charged particle ray such as an electron beam).

Examples of the radical generator include, but not limited to: 2,4,5-triarylimidazole dimers that may have a substituent such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives such as 2-benzyl-2-dimethylamino-1-(4-morpholinophenyl)-butanone-1,2-methyl-1-[4-(methylthio)phenyl]-2-morpholino-propan-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-di phenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin and benzoin derivatives such as methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone and acetophenone derivatives such as 3-methylacetophenone, acetophenone benzyl ketal, 1-hydroxycyclohexyl phenyl ketone, and 2,2-dimethoxy-2-phenylacetophenone; thioxanthone and thioxanthone derivatives such as diethylthioxanthone, 2-isopropylthioxanthone, and 2-chlorothioxanthone; acylphosphine oxide derivatives such as 2,4,6-trimethylbenzoyl diphenyl phosphine oxide, bis(2,4,6-trimethylbenzoyl) phenyl phosphine oxide, and bis(2,6-dimethoxybenzoyl)-2,4,4-trimethylpentyl phosphine oxide; oxime ester derivatives such as 1,2-octanedione-1-[4-(phenylthio)phenyl]-2-(O-benzoyloxime) and ethanone-1-[9-ethyl-6-(2-methylbenzoyl)-9H-carbazol-3-yl]-1-(O-acetyloxime); xanthone; fluorenone; benzaldehyde; fluorene; anthraquinone; triphenylamine; carb azole; 1-(4-isopropylphenyl)-2-hydroxy-2-methylpropan-1-one; and 2-hydroxy-2-methyl-1-phenylpropan-1-one.

Examples of commercial products corresponding to the radical generator include, but not limited to, Irgacure 184, 369, 651, 500, 819, 907, 784, and 2959, CGI-1700, -1750, and -1850, CG24-61, Darocur 1116 and 1173, Lucirin TPO, LR8893, and LR8970 (all of which are manufactured by BASF), and Ubecryl P36 (manufactured by UCB).

Of those, the component (B) is preferably an acylphosphine oxide-based polymerization initiator or an alkylphenone-based polymerization initiator. The acylphosphine oxide-based polymerization initiator is, of the examples described above, an acylphosphine oxide compound such as 2,4,6-trimethylbenzoyl diphenyl phosphine oxide, bis(2,4,6-trimethylbenzoyl) phenyl phosphine oxide, or bis(2,6-dimethoxybenzoyl)-2,4,4-trimethylpentyl phosphine oxide. In addition, the alkylphenone-based polymerization initiator is, of the examples described above: a benzoin ether derivative such as benzoin methyl ether, benzoin ethyl ether, or benzoin phenyl ether; benzoin or a benzoin derivative such as methylbenzoin, ethylbenzoin, or propylbenzoin; a benzyl derivative such as benzyl dimethyl ketal; acetophenone or an acetophenone derivative such as 3-methylacetophenone, acetophenone benzyl ketal, 1-hydroxycyclohexyl phenyl ketone, or 2,2-dimethoxy-2-phenylacetophenone; or an α-amino aromatic ketone derivative such as 2-benzyl-2-dimethylamino-1-(4-morpholinophenyl)-butanone-1,2-methyl-1-[4-(methylthio)phenyl]-2-morpholinopropan-1-one.

In the present invention, it is preferred that the curable composition (α1) be substantially free of photoreactivity. To this end, the blending ratio of the component (B) serving as a photopolymerization initiator in the curable composition (α1) is preferably less than 0.1 wt % with respect to the total weight of the component (A), the component (B), and the component (C) serving as a non-polymerizable compound to be described later, i.e., the total weight of the components of the curable composition (α1') that is the components of the curable composition (α1) except the component (D) serving as a solvent. In addition, the blending ratio is more preferably 0.01 wt % or less, and still more preferably 0.001 wt % or less.

When the blending ratio of the component (B) in the curable composition (α1') is set to less than 0.1 wt %, the curable composition (α1) is substantially free of photoreactivity. In the imprint technology, it is probable that leaking light be generated owing to the configuration of the apparatus, when a shot region is irradiated. In the case, an adjacent shot region where is adjacent to the shot region and in which the imprint step has not been progressed may be irradiated by the leaking light. If the curable composition (α1) is free of photoreactivity, photocuring of the curable composition (α1') is not progressed in the adjacent shot region in which the imprint step has not been progressed by the leaking light, hence a pattern including little nonfill defects can be obtained with short filling time in the shot region.

Preferably, the curable composition (α2) includes two or more photocurable compounds (B). If the curable composition (α2) includes two or more photocurable compounds (B), photocurability of the mixture of the curable composition (α1) and the curable composition (α2) can be improved.

The blending ratio of the component (B) serving as a photopolymerization initiator in the curable composition (α2) is desirably 0 wt % or more and 50 wt % or less with respect to the total weight of the component (A), the component (B), and the component (C) to be described later, i.e., the total weight of the components of the curable composition (α2') that is the components of the curable composition (α2) except the component (D) serving as a solvent. In addition, the blending ratio is preferably 0.1 wt % or more and 20 wt % or less, more preferably 1 wt % or more and 20 wt % or less.

When the blending ratio of the component (B) is set to 0.1 wt % or more with respect to the total weight of the component (A), the component (B), and the component (C), the curing rate of the curable composition (α2) increases and hence reaction efficiency can be improved. In addition, when the blending ratio of the component (B) is set to 50 wt % or less with respect to the total weight of the component (A), the component (B), and the component (C), a cured film to be obtained can be turned into a cured film having some degree of mechanical strength.

<Non-Polymerizable Component (C)>

The curable compositions (α) according to this embodiment may each further contain the component (C) serving as a non-polymerizable compound in addition to the component (A) and the component (B) described in the foregoing in accordance with various purposes to the extent that the effects of the present invention are not impaired. Examples of such component (C) include a sensitizer, a hydrogen donor, an internal addition-type release agent, a surfactant, an antioxidant, a polymer component, and other additives.

The sensitizer is a compound to be appropriately added for the purpose of accelerating a polymerization reaction or enhancing a reaction conversion ratio. As the sensitizer, there is given, for example, a sensitizing dye.

The sensitizing dye is a compound that is excited by absorbing light having a specific wavelength to interact with the polymerization initiator serving as the component (B). The term "interaction" described herein refers to, for example, the transfer of energy or an electron from the sensitizing dye in an excited state to the photopolymerization initiator serving as the component (B).

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye.

One kind of the sensitizers may be used alone, or two or more kinds thereof may be used as a mixture.

The hydrogen donor is a compound capable of reacting with an initiation radical generated from the photopolymerization initiator serving as the component (B) or the radical of a polymerization growth terminal to generate a more reactive radical. The hydrogen donor is preferably added when the component (B) is a photoradical generator.

Specific examples of such hydrogen donor include, but not limited to, amine compounds such as n-butylamine, di-n-butylamine, tri-n-butylamine, allylthiourea, triethylamine, triethylenetetramine, a 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine, and mercapto compounds such as 2-mercapto-N-phenylbenzimidazole and a mercaptopropionic acid ester, sulfur compound such as s-benzylisothiuronium-p-toluenesulfinate, and phosphorus compound such as tri-n-butylphosphine.

One kind of the hydrogen donors may be used alone, or two or more kinds thereof may be used as a mixture. In addition, the hydrogen donor may have a function as a sensitizer.

The internal addition-type release agent may be added to each of the curable compositions (α) for the purpose of reducing an interfacial bonding force between a mold and a resist, i.e., reducing a release force in a releasing step to be described later. The term "internal addition-type" as used herein means that the release agent is added to each of the curable compositions (α) prior to an arranging or applying step to be described later.

For example, surfactants such as a silicone-based surfactant, a fluorine-based surfactant, and a hydrocarbon-based surfactant, can each be used as the internal addition-type release agent. In this embodiment, the internal addition-type release agent is free of polymerizability.

Examples of the fluorine-based surfactant include a polyalkylene oxide (such as polyethylene oxide or polypropylene oxide) adduct of an alcohol having a perfluoroalkyl group, and a polyalkylene oxide (such as polyethylene oxide or polypropylene oxide) adduct of perfluoropolyether. The fluorine-based surfactant may have, for example, a hydroxyl group, an alkoxy group, an alkyl group, an amino group, or a thiol group on part (for example, as a terminal group) of its molecular structure.

As the fluorine-based surfactant, a commercial product may be used. Examples of the commercial product of the fluorine-based surfactant include, but not limited to, MEGAFAC F-444, TF-2066, TF-2067, and TF-2068 (all of which are manufactured by DIC Corporation), Fluorad FC-430 and FC-431 (both of which are manufactured by Sumitomo 3M Limited), Surflon S-382 (manufactured by AGC), EFTOP EF-122A, 122B, and 122C, EF-121, EF-126, EF-127, and MF-100 (all of which are manufactured by Tohkem Products Corp.), PF-636, PF-6320, PF-656, and PF-6520 (all of which are manufactured by OMNOVA Solutions), UNIDYNE DS-401, DS-403, and DS-451 (all of which are manufactured by Daikin Industries, Ltd.), and Ftergent 250, 251, 222F, and 208G (all of which are manufactured by Neos Corporation).

The hydrocarbon-based surfactant includes, for example, an alkyl alcohol polyalkylene oxide adduct, in which an alkylene oxide having 2 or more and 4 or less carbon atoms is added to an alkyl alcohol having 1 or more and 50 or less carbon atoms.

Examples of the alkyl alcohol polyalkylene oxide adduct include a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, and a stearyl alcohol ethylene oxide/propylene oxide adduct. The terminal group of the alkyl alcohol polyalkylene oxide adduct is not limited to a hydroxyl group, which is simply produced by adding a polyalkylene oxide to an alkyl alcohol. The hydroxyl group may be converted to another substituent, for example, a polar functional group such as a carboxyl group, an amino group, a pyridyl group, a thiol group, or a silanol group, or a hydrophobic functional group such as an alkyl group or an alkoxy group.

As the alkyl alcohol polyalkylene oxide adduct, a commercial product may be used. Examples of the commercial product of the alkyl alcohol polyalkylene oxide adduct include, but not limited to, polyoxyethylene methyl ether (methyl alcohol ethylene oxide adduct) (BLAUNON MP-400, MP-550, and MP-1000) manufactured by Aoki Oil Industrial Co., Ltd., polyoxyethylene decyl ether (decyl alcohol ethylene oxide adduct) (FINESURF D-1303, D-1305, D-1307, and D-1310) manufactured by Aoki Oil Industrial Co., Ltd., polyoxyethylene lauryl ether (lauryl alcohol ethylene oxide adduct) (BLAUNON EL-1505) manufactured by Aoki Oil Industrial Co., Ltd., polyoxyethylene cetyl ether (cetyl alcohol ethylene oxide adduct) (BLAUNON CH-305 and CH-310) manufactured by Aoki Oil Industrial Co., Ltd., polyoxyethylene stearyl ether (stearyl alcohol ethylene oxide adduct) (BLAUNON SR-705, SR-707, SR-715, SR-720, SR-730, and SR-750) manufactured by Aoki Oil Industrial Co., Ltd., random polymerization-type polyoxyethylene polyoxypropylene stearyl ether (BLAUNON SA-50/50 1000R and SA-30/70 2000R) manufactured by Aoki Oil Industrial Co., Ltd., polyoxyethylene methyl ether (Pluriol A760E) manufactured by BASF, and polyoxyethylene alkyl ethers (EMULGEN Series) manufactured by Kao Corporation.

Of those hydrocarbon-based surfactants, the alkyl alcohol polyalkylene oxide adduct is preferred as the internal addition-type release agent, and a long-chain alkyl alcohol polyalkylene oxide adduct is more preferred.

One kind of the internal addition-type release agents may be used alone, or two or more kinds thereof may be used as a mixture.

When the internal addition-type release agent is added to each of the curable compositions, at least one of a fluorine-based surfactant or a hydrocarbon-based surfactant is preferably added as the internal addition-type release agent.

The blending ratio of the component (C) serving as a non-polymerizable compound in each of the curable compositions (α) is 0 wt % or more and 50 wt % or less, preferably 0.1 wt % or more and 50 wt % or less, more preferably 0.1 wt % or more and 20 mass % or less with respect to the total weight of the component (A), the component (B), and the component (C), i.e., the total weight of all components of the curable composition (α') that is the components of the curable composition (α) except the solvent component (D).

When the blending ratio of the component (C) is set to 50 wt % or less with respect to the total weight of the component (A), the component (B), and the component (C), a cured product to be obtained can be turned into a cured product having some degree of mechanical strength.

<Solvent Component (D)>

The curable compositions (α) according to this embodiment may each contain a solvent as the component (D). The component (D) is not particularly limited as long as the component is a solvent that dissolves the component (A), the component (B), and the component (C). The solvent is preferably a solvent having a boiling point at normal pressure of 80° C. or more and 200° C. or less. The solvent is more preferably a solvent having at least one of a hydroxyl group, an ether structure, an ester structure, or a ketone structure.

A preferred specific example of the component (D) according to this embodiment is a single solvent selected from: alcohol-based solvents such as propyl alcohol, isopropyl alcohol, and butyl alcohol; ether-based solvents such as ethylene glycol monomethyl ether, ethylene glycol dimethyl ether, ethylene glycol monoethyl ether, ethylene glycol diethyl ether, ethylene glycol monobutyl ether, and propylene glycol monomethyl ether; ester-based solvents such as butyl acetate, ethylene glycol monoethyl ether acetate, ethylene glycol monobutyl ether acetate, and propylene glycol monomethyl ether acetate; and ketone-based solvents such as methyl isobutyl ketone, diisobutyl ketone, cyclohexanone, 2-heptanone, γ-butyrolactone, and ethyl lactate, or a mixed solvent of two or more kinds thereof.

The curable composition ($\alpha 1$) according to this embodiment preferably contains the component (D). This is because, as described later, a spin coating method is preferred as a method of applying the curable composition ($\alpha 1$) onto the substrate. In this case, a single solution selected from propylene glycol monomethyl ether acetate, propylene glycol monomethyl ether, cyclohexanone, 2-heptanone, γ-butyrolactone, and ethyl lactate, or a mixed solution of two or more kinds thereof is particularly preferred from the viewpoint of applicability.

The blending ratio of the component (D) according to this embodiment in the curable composition ($\alpha 1$), which can be appropriately adjusted in accordance with, for example, the viscosity or applicability of the component (A), the component (B), or the component (C), or the thickness of a liquid film to be formed, is preferably 70 wt % or more with respect to the total amount of the curable composition ($\alpha 1$). The blending ratio is more preferably 90 wt % or more, still more preferably 95 wt % or more. As the blending ratio of the component (D) increases, the thickness of the liquid film to be formed can be reduced. When the blending ratio of the component (D) in the curable composition ($\alpha 1$) is 70 wt % or less, sufficient applicability is not obtained in some cases.

In addition, a solvent can be used in the curable composition ($\alpha 2$) according to this embodiment, but it is preferred that the curable composition ($\alpha 2$) be substantially free of a solvent. The phrase "substantially free of a solvent" as used herein means that the composition is free of a solvent except a solvent to be unintentionally incorporated such as an impurity. That is, for example, the content of the solvent in the curable composition ($\alpha 2$) according to this embodiment is preferably 3 wt % or less, more preferably 1 wt % or less with respect to the entirety of the curable composition ($\alpha 2$). The term "solvent" as used herein refers to a solvent that has been generally used in a curable composition or a photoresist. That is, the kind of the solvent is not particularly limited as long as the compounds to be used in the present invention are dissolved and uniformly dispersed in the solvent, and the solvent does not react with any one of the compounds.

The curable compositions ($\alpha$) according to this embodiment are preferably curable compositions for nanoimprint, more preferably curable compositions for photo-nanoimprint, still more preferably curable compositions to be used in the SST-NIL process, i.e., curable compositions for SST-NIL.

The ratio of the component (A), the component (B), the component (C), or the component (D) in each of the curable compositions ($\alpha$) according to this embodiment can be determined through the analysis of the curable composition ($\alpha$) or a cured product obtained by curing the composition by, for example, infrared spectroscopy, ultraviolet-visible spectroscopy, or pyrolysis gas chromatograph mass spectrometry.

<Temperature at Time of Blending of Curable Compositions ($\alpha$)>

When the curable compositions ($\alpha$) according to this embodiment are prepared, each components are mixed and dissolved under a predetermined temperature condition. Specifically, the preparation is performed in a range of from 0° C. or more to 100° C. or less <Viscosity of Curable Compositions ($\alpha$)>

The curable compositions ($\alpha 1$) and ($\alpha 2$) according to this embodiment are preferably liquid. This is because in a mold contacting step to be described later, the spread and fill of the curable composition ($\alpha 1$) and/or the curable composition ($\alpha 2$) are quickly completed, in other words, a filling time is short.

In the curable composition ($\alpha 1$) according to this embodiment, the viscosity of the components of the curable composition ($\alpha 1'$) that is the components of the curable composition ($\alpha 1$) except the component (D) serving as a solvent at 23° C. is preferably 1 mPa·s or more and 1,000 mPa·s or less. In addition, the viscosity is more preferably 1 mPa·s or more and 500 mPa·s or less, still more preferably 1 mPa·s or more and 100 mPa·s or less.

In the curable composition ($\alpha 2$) according to this embodiment, the viscosity of the components of the curable composition ($\alpha 2'$) that is the components of the curable composition ($\alpha 2$) except the component (D) serving as a solvent at 23° C. is preferably 1 mPa·s or more and 100 mPa·s or less. In addition, the viscosity is more preferably 1 mPa·s or more and 50 mPa·s or less, still more preferably 1 mPa·s or more and 12 mPa·s or less.

When the viscosities of the curable compositions ($\alpha 2'$) that is the components of the curable composition ($\alpha 2$) except the component (D) serving as a solvent are set to 100 mPa·s or less, spread and fill are quickly completed at the time of the bringing of the curable compositions ($\alpha 2'$) into contact with the mold (S. Reddy, R. T. Bonnecaze, Microelectronic Engineering, 82, (2005) 60-70). In other words, when the curable compositions ($\alpha$) according to this embodiment are used, a photo-nanoimprint method can be performed at high yield (throughput). In addition, a pattern defect due to a filling failure hardly occurs.

In addition, when the viscosities are set to 1 mPa·s or more, application unevenness hardly occurs at the time of the application of the curable compositions ($\alpha$) onto the substrate. Further, when the curable compositions ($\alpha$) are brought into contact with the mold, the curable compositions ($\alpha$) hardly flow out of an end portion of the mold.

<Surface Tension of Curable Compositions ($\alpha$)>

With regard to the surface tension of the curable compositions ($\alpha$) according to this embodiment, the surface tension of the composition of the components of the curable composition ($\alpha'$) that is the components of the curable composition ($\alpha$) except the component (D) serving as a solvent at 23° C. is preferably 5 mN/m or more and 70 mN/m or less. In addition, the surface tension is more preferably 7 mN/m or more and 50 mN/m or less, still more preferably 10 mN/m or more and 40 mN/m or less. In this case, as the surface tension becomes higher, e.g., when the surface tension is 5 mN/m or more, a stronger capillary force acts, and hence the spread and the fill of the curable compositions ($\alpha$) are completed within a shorter time period at the time of the bringing of the curable composition ($\alpha$) into contact with the mold (S. Reddy, R. T. Bonnecaze, Microelectronic Engineering, 82, (2005) 60-70).

In addition, when the surface tension is set to 70 mN/m or less, a cured product obtained by curing the curable compositions ($\alpha$) becomes a cured product having surface smoothness.

In this embodiment, the surface tension of the composition of the components of the curable composition (α1') that is the components of the curable composition (α1) except the component (D) serving as a solvent is preferably higher than the surface tension of the composition of the components of the curable composition (α2') that is the components of the curable composition (α2) except the component (D) serving as a solvent. This is because of the following reason. Before the mold contacting step, the prespread of the curable composition (α2) is accelerated (droplets spread over a wide range) by a Marangoni effect to be described later, and hence a time period required for spread in the mold contacting step to be described later is shortened. As a result, a filling time is shortened.

The Marangoni effect is a free surface movement phenomenon resulting from a local difference in surface tension between liquids (N. Imaishi, Int. J. Microgravity Sci. No. 31 Supplement 2014 (S5-S12)). The difference in surface tension, i.e., surface energy, serves as a driving force to cause such diffusion that a liquid having a low surface tension covers a wider surface. In other words, when the curable composition (α1') having a high surface tension is applied to the entire surface of the substrate and the curable composition (α2) having a low surface tension is dispensed dropwise, the prespread of the curable composition (α2) is accelerated.

<Contact Angle of Curable Compositions (α)>

With regard to the contact angle of each of the curable compositions (α1) and (α2) according to this embodiment, the contact angle of the composition formed of the components of the curable compositions (α1') and (α2') which are the components of the curable composition (α1) and (α2) except the component (D) serving as a solvent is preferably 0° or more and 90° or less with respect to each of both the surface of the substrate and the surface of the mold, respectively. When the contact angle is more than 90°, a capillary force acts in a negative direction (direction in which a contact interface between the mold and the curable composition is shrunk) in a mold pattern or in a gap between the substrate and the mold, and hence the composition is not filled. The contact angle is particularly preferably 0° or more and 30° or less. As the contact angle becomes lower, a stronger capillary force acts and hence a filling rate increases (S. Reddy, R. T. Bonnecaze, Microelectronic Engineering, 82, (2005) 60-70).

[Impurities Mixed in Curable Compositions (α)]

It is preferred that the curable compositions (α) according to this embodiment each be free of impurities to the extent possible. The term "impurities" as described herein refers to components except components intentionally incorporated into each of the curable compositions (α). That is, the term refers to components except the component (A), the component (B), the component (C), and the component (D). Specific examples thereof include, but not limited to, particles, metal impurities, and organic impurities.

<Particles>

In this embodiment, the particles refer to fine foreign particles. The particles typically refer to a gel-like or solid particulate substance having a particle diameter (diameter) of from several nanometers to several micrometers, or air bubbles such as nanobubbles or microbubbles (hereinafter simply referred to as "nanobubbles").

When a photo-nanoimprint process is performed with the curable compositions (α) each containing the particles, an inconvenience such as the breakage of the mold or a defect of a pattern after molding, occurs. For example, when the particles are present in the curable composition (α) applied onto the substrate in the arranging step in the photo-nanoimprint process, the breakage of the mold may occur in a mold contacting step (3) or an aligning step to be described later. For example, a groove portion of a groove/land pattern formed on the surface of the mold is clogged with the particles, or the groove portion is expanded by the particles, and as a result, the groove/land pattern is broken. In association with the foregoing, the following inconvenience may occur: a pattern defect occurs and hence a desired circuit cannot be formed.

In addition, the presence of the nanobubbles in each of the curable compositions (α) may reduce the curability of the curable composition (α). This is probably because the polymerization reaction of the curable composition (α) is inhibited by, for example, oxygen in the nanobubbles. In addition, the presence of the nanobubbles in each of the curable compositions (α) results in the formation of a groove/land pattern lacking a portion where the nanobubbles are present, and hence causes an inconvenience in a cured product pattern to be formed in some cases.

Accordingly, the number concentration (particles/mL) of the particles contained in each of the curable compositions (α) is preferably as low as possible. Further, the particle diameters of the particles contained in each of the curable compositions (α) are preferably as small as possible.

(Number Concentration of Particles)

As described above, when particles each having a particle diameter equal to or more than a certain value are incorporated in a large amount into each of the curable compositions (α), the nanoimprint process may be affected. Particularly in the case where the nanoimprint process to be described later is repeated in different regions on the substrate a plurality of times, when the mold breaks in the course of the repetition, inconveniences occur in all subsequent transfer patterns. As a result, a yield significantly reduces.

In order that such reduction in yield may be suppressed, it is sufficient that the number of particles to be incorporated into the curable composition (α1') that is the components of the curable composition (α1) except the component (D) serving as a solvent which is arranged onto a substrate (wafer) and/or a layer which is liquid film of the curable composition (α2) is less than 1. That is, it is sufficient that the number of particles to be incorporated into each of the curable compositions (α) each having a volume necessary for treating one substrate (wafer) be set to less than 1.

As an example of this embodiment, it is hypothesized that a cured product having an average thickness of 33 nm is produced with a mold (measuring 26 mm in a horizontal direction by 33 mm in a vertical direction) with a 28 nm line and space (L/S) pattern in which the width S of the groove portion of the mold is 28 nm and the width S of the land portion of the mold is 28 nm by the SST-NIL process. At this time, it is hypothesized that out of a step (1) to a step (5) to be described later, in the arranging step (1), the curable composition (α1) serving as a component for the material for an imprint pretreatment coating having an average thickness of 7 nm is laid on the substrate and then the component (D) serving as a solvent is volatilized by spin-coated method. After that, in an applying step (2), droplets of the curable composition (α2) whose amount corresponds to a film having a thickness of 30 nm are dispensed dropwise discretely onto the layer having an average thickness of 3 nm of the curable composition (α1') that is the components of the curable composition (α1) except the component (D) serving as a solvent to produce the cured product having an average thickness of 33 nm.

At this time, when the curable composition (α1) having an average thickness of 7 nm is arranged (laid) on a 300-millimeter wafer by a spin coating method, 494.8 nL of the curable composition (α1) needs to be arranged. Therefore, about 2,021 300-millimeter wafers can be treated per mL of the curable composition (α1) serving as a component for the material for an imprint pretreatment coating.

Therefore, when the SST-NIL process is performed with a 300-millimeter wafer, the number concentration (particles/mL) of the particles contained in the curable composition (α1) is preferably set to less than 2,021 particles/mL. Thus, even after the component (D) serving as a solvent is volatilized from the curable composition (α1) by laying the curable composition (α1) with spin-coated method, the number of the particles incorporated in the layer of the curable composition (α1') per 300-millimeter wafer can be set to less than 1, and hence the yield of the SST-NIL process can be improved.

Similarly, when the SST-NIL process is performed with a 450-millimeter wafer, the number concentration (particles/mL) of the particles contained in the curable composition (α1) is preferably set to less than 898 particles/mL.

Meanwhile, when the droplets of the curable composition (α2) corresponding to a thickness of 30 nm are dispensed dropwise discretely onto the entire upper surface of the 300-millimeter wafer having laid thereon the curable composition (α1) by a combination of a full field shot and a partial field shot, 2,121 nL of the curable composition (α2) needs to be dispensed dropwise. Therefore, about 471.6 300-millimeter wafers can be treated per mL of the curable composition (α2).

Therefore, when the SST-NIL process is performed with a 300-millimeter wafer, the number concentration (particles/mL) of the particles contained in the curable composition (α2) is preferably set to less than 471 particles/mL. Thus, the number of the particles per 300-millimeter wafer can be set to less than 1, and hence the yield of the SST-NIL process can be improved.

Similarly, when the SST-NIL process is performed with a 450-millimeter wafer, the number concentration (particles/mL) of the particles contained in the curable composition (α2) is preferably set to less than 209 particles/mL.

(Particle Size)

When a certain force acts on the groove/land pattern formed on the surface of the mold to open the tip of a land portion of the groove/land pattern, and hence the tip is brought into contact with an adjacent land portion, a state in which the breakage of the mold is liable to occur is established. An influence of the particles contained in each of the curable compositions (α) is considered.

Figure 4A:
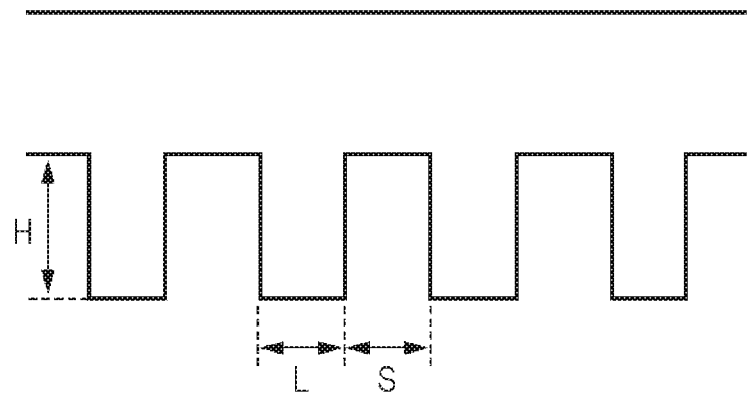
FIGS. 4A and 4B are views for schematically illustrating a relationship between the width of each of a groove portion and a land portion of the pattern of a mold, and the particle diameter of a particle.
Figure 4B:
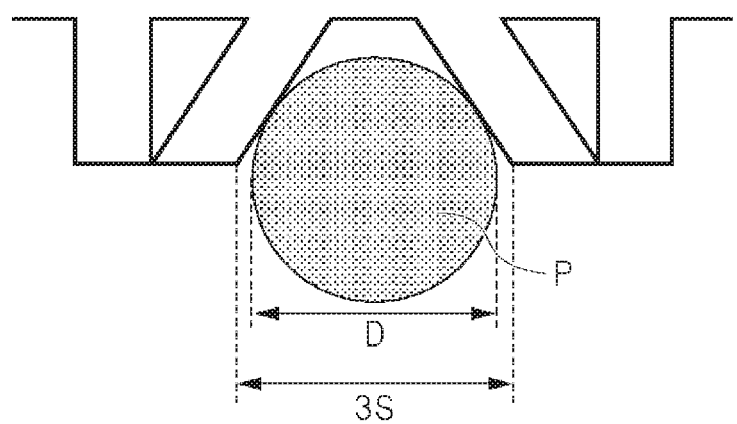

FIGS. 4A and 4B are sectional views of a mold for schematically illustrating a groove/land pattern formed on the surface of a mold. Considered is such a mold with an L/S pattern that the height of the pattern of the mold is H (nm), the width of a groove portion of the mold is S (nm) and the width of a land portion thereof is L (nm) as illustrated in FIG. 4A.

When a land portion formed on the surface of the mold opens to be brought into contact with adjacent land portions as illustrated in FIG. 4B, a distance between the opened land portions becomes 3S (nm). Therefore, it can be approximately assumed that the mold breaks when a particle diameter D (nm) of a particle P is larger than 3S (nm) (D>3 S) as illustrated in FIG. 4B.

Therefore, for example, in the case where even one particle P having a particle diameter D of 0.07 μm or more is present on a wafer, when a mold with an L/S pattern in which the S is less than 23.3 nm is used, the breakage of the mold may occur.

In actuality, the mold does not break strictly when D>3S because the deformability of the mold varies depending on, for example, a material for the mold, the shape of the groove/land pattern, the H, the S, the L, or the aspect ratio (H/L and H/S) of the groove/land pattern, and the breakage has a certain allowable range. That is, the breakage of the mold may occur even when the ratio (D/S) of the D to the S is 3 or less. Therefore, the number concentration of particles each having a particle diameter D of 2.5S (nm) or more in the curable composition (α1) according to this embodiment is preferably less than 2,021 particles/mL. In addition, the number concentration of particles each having a particle diameter D of 2.5S (nm) or more in the curable composition (α2) according to this embodiment is preferably less than 471 particles/mL.

The width S (nm) of the groove portion of the groove/land pattern formed on the surface of the mold is preferably 4 nm or more and less than 30 nm, more preferably 10 nm or more and less than 23.3 nm. In addition to the foregoing, particularly in the case of a semiconductor production application, a mold having an aspect ratio (H/L) of the height H of the pattern of the mold 205 with respect to the width L of the land portion of the mold 205 is 1 or more and 10 or less is preferably used.

In view of the foregoing, with regard to the number concentration (particles/mL) of the particles P contained in the curable composition (α1), when the width of the groove portion of the groove/land pattern of the mold is S (nm), the number concentration of the particles P each having a particle diameter D of 2.5S (nm) or more is preferably less than 2,021 particles/mL. Thus, the yield of the SST-NIL process can be improved. In addition, with regard to the number concentration (particles/mL) of the particles contained in the curable composition (α2), when the width of the groove portion of the groove/land pattern of the mold is S (nm), the number concentration of the particles each having a particle diameter of 2.5S (nm) or more is preferably less than 471 particles/mL. Thus, the yield of the SST-NIL process can be improved.

In addition, the number concentration (particles/mL) of the particles P each having a particle diameter D of 0.07 μm or more contained in the curable composition (α1) is more preferably less than 2,021 particles/mL. Thus, when the SST-NIL process is performed with a 300-millimeter wafer, the yield of the SST-NIL process can be improved. Further, with regard to the number concentration (particles/mL) of the particles contained in the curable composition (α1), the number concentration (particles/mL) of the particles P each having a particle diameter D of 0.07 μm or more is still more preferably less than 898 particles/mL. Thus, when the SST-NIL process is performed with a 450-millimeter wafer, the yield of the SST-NIL process can be improved.

In addition, the number concentration (particles/mL) of the particles P each having a particle diameter D of 0.07 μm or more contained in the curable composition (α2) is more preferably less than 471 particles/mL. Thus, when the SST-NIL process is performed with a 300-millimeter wafer, the yield of the SST-NIL process can be improved. Further, with regard to the number concentration (particles/mL) of the particles contained in the curable composition (α2), the number concentration (particles/mL) of the particles P each having a particle diameter D of 0.07 μm or more is still more preferably less than 209 particles/mL. Thus, when the SST- NIL process is performed with a 450-millimeter wafer, the yield of the SST-NIL process can be improved.

<Metal Impurities>

In the case where a semiconductor device is produced with the curable compositions (α) according to this embodiment, when metal impurities are present in the curable compositions (α), the application of the curable compositions (α) leads to the contamination of a substrate to be processed with the metal impurities. As a result, the semiconductor characteristics of the semiconductor device to be obtained may be affected. That is, the yield of the SST-NIL process may reduce.

Accordingly, the concentration of the metal impurities in each of the curable compositions (α) is preferably as low as possible. With regard to the concentration of the metal impurities contained in each of the curable compositions (α), the concentrations of various elements are set to preferably 100 ppb (100 ng/g) or less, more preferably 1 ppb (1 ng/g) or less. The term "various elements" as used herein refers to metal elements, and refers to, for example, Na, Ca, Fe, K, Zn, Al, Mg, Ni, Cr, Cu, Pb, Mn, Li, Sn, Pd, Ba, Co, and Sr. Setting the concentrations of those elements in each of the curable compositions (α) within the above-mentioned range can reduce the influences of the curable compositions (α) on the semiconductor characteristics of the semiconductor device. That is, a reduction in yield of the SST-NIL process can be suppressed.

<Organic Impurities>

In the case where a semiconductor device is produced with the curable compositions (α) according to this embodiment, when organic impurities are present in the curable compositions (α), an inconvenience may occur. For example, when the organic impurities are present in the curable compositions (α), an inconvenience such as a defect of a pattern after molding, occurs.

[Measurement of Number Concentration of Particles Contained in Each of Curable Compositions (α)]

The number concentration (particles/mL) and particle diameter distribution of the particles contained in each of the curable compositions (α) can be measured by a method such as a light scattering-type liquid-borne particle counter (light scattering-type LPC) or a dynamic light scattering-type particle diameter distribution measuring apparatus (DLS). The light scattering-type LPC is preferably used in the measurement of the number concentration of the particles in each of the curable compositions (α) each having a small particle concentration (particles/mL), i.e., a high degree of cleanliness like this embodiment.

The light scattering-type LPC detects scattered light emitted from particles in a liquid when the liquid is irradiated with laser light. At this time, the intensity of the scattered light depends on the sizes of the particles. The light scattering-type LPC can measure the particle diameters and number concentration of the particles in the liquid through the utilization of the foregoing.

Specific examples of the light scattering-type LPC include a liquid-borne particle sensor KS Series (manufactured by Rion Co., Ltd.), and liquid-borne particle counters Ultra-Chem Series, SLS Series, and HSLIS Series (manufactured by Particle Measuring Systems). The model of the liquid-borne particle counter to be used in the measurement needs to be properly selected in accordance with the liquid to be measured because the composition of a measurable liquid and the smallest measurable particle diameter vary depending on the model.

In the case of, for example, each of the curable compositions (α) each having a small content of the solvent (D), especially the curable composition (α2), it is known that the ratio of a detected signal and noise (S/N ratio) reduces because a background noise due to molecular scattered light is large. Accordingly, it is difficult to measure the number concentration and particle diameter distribution of the particles of each of the curable compositions (α) according to this embodiment, especially the curable composition (α2) as compared to an aqueous material. Accordingly, in this embodiment, even in the measurement of each of the curable compositions (α), an apparatus that can measure the number concentration of particles each having a particle diameter as small as, for example, 0.07 μm is preferably used.

The curable composition (α1) according to this embodiment has a feature in that the composition has a number concentration of particles each having a particle diameter of 0.07 μm or more of less than 2,021 particles/mL. In addition, the curable composition (α2) according to this embodiment has a feature in that the composition has a number concentration of particles each having a particle diameter of 0.07 μm or more of less than 471 particles/mL. The number concentration (particles/mL) of the particles each having a particle diameter of 0.07 μm or more contained in each of the curable compositions (α) according to this embodiment can be measured with, for example, a liquid-borne particle sensor KS-41B (with an option capable of corresponding to a particle diameter as small as 0.07 μm) (manufactured by Rion Co., Ltd.) or a liquid-borne particle sensor KS-18F (manufactured by Rion Co., Ltd.). In addition, at this time, a controller KE-40B1 (manufactured by Rion Co., Ltd.) and a syringe sampler KZ-30W1 (manufactured by Rion Co., Ltd.) are preferably used in combination.

All the measurements of the number concentrations of particles herein are preferably performed after the light scattering-type LPC has been calibrated in advance with polystyrene latex (PSL) standard particles each having a known particle diameter, the particles being dispersed in pure water. In addition, immediately after the measurement, software KF-50A for pulse-height analysis (manufactured by Rion Co., Ltd.) is preferably used to confirm that the accuracy of a measured value for the number concentration of the particles each having a particle diameter of 0.07 μm or more is sufficiently secured. Specifically, the following is preferably performed: a ratio (s/n) between a voltage value s of an element for receiving the scattered light of an aqueous solution of 0.07-micrometer PSL particles and a voltage value n of an element for receiving the scattered light of a liquid to be measured is determined, and the fact that the ratio is much larger than 1.3 is confirmed.

[Method of Producing Each of Curable Compositions (α) for SST-NIL]

Next, a method of producing each of the curable compositions (α) according to this embodiment is described.

The curable compositions (α) according to this embodiment are suitable for the SST-NIL process, and are more suitable for the SST-NIL process in a semiconductor production application.

As described in the foregoing, the curable compositions (α) according to this embodiment are each preferably free of impurities such as particles and metal impurities, to the extent possible. Therefore, the curable compositions (α) according to this embodiment are preferably obtained through a purifying step. Examples of such purifying step include a particle removing step, a metal impurity removing step, and an organic impurity removing step. The method of producing each of the curable compositions (α) particularly preferably includes the particle removing step out of those steps for suppressing the breakage of the mold.

The particle removing step according to this embodiment is preferably, for example, filtration with a particle filter (hereinafter simply referred to as "filter"). The term "filtration" as used herein includes the case where any such composition is simply "passed through the filter" in addition to the typically used meaning of the "filtration" including a process for the separation of a solid from a fluid. That is, the term includes, for example, the case where any such composition is passed through a film such as a filter, and hence a gel or a solid trapped with the film cannot be visually observed.

The pore diameter of the filter to be used in the particle removing step according to this embodiment is preferably 0.001 µm or more and 5.0 µm or less. In addition, in order that the number concentration (particles/mL) of particles each having a particle diameter of 0.07 µm or more may be reduced, a filter having a pore diameter of 50 nm or less is more preferred, and a filter having a pore diameter of 1 nm or more and 5 nm or less is particularly preferred. When the filtration is performed with a filter having a pore diameter of less than 1 nm, a necessary component in each of the curable compositions (α) may be removed. Accordingly, the pore diameter of the filter is preferably 1 nm or more. The "pore diameter" of the filter as used herein is the average pore diameter of fine pores of the filter.

When the filtration with the filter is performed, a crude curable composition (α) for nanoimprint (hereinafter referred to as "crude curable composition (α)") is passed through the filter at least once. The crude curable composition (α) refers to the curable composition (α) before the performance of the purifying step such as the filtration. The crude curable composition (α) is specifically a mixed liquid obtained by mixing the component (A), and the component (B) serving as a photopolymerization initiator, the component (C) serving as a non-polymerizable compound, and the component (D) serving as a solvent that are to be added as required.

A filter made of, for example, a polyethylene resin, a polypropylene resin, a fluorine resin, or a nylon resin can be used as the filter to be used in the filtration, but the filter is not limited thereto. Specific examples of the filter that can be used in this embodiment include "Ultipleat P-Nylon 66", "Ultipor N66", and "P Emflon" (all of which are manufactured by Nihon Pall Ltd.), "LifeASSURE PSN Series", "LifeASSURE EF Series", "PhotoSHIELD", and "Electropor II EF" (all of which are manufactured by Sumitomo 3M Limited), and "Microgard", "Optimizer D", "Impact Mini", and "Impact 2" (all of which are manufactured by Nihon Entegris K.K.). One kind of those filters may be used alone, or two or more kinds thereof may be used in combination.

It is preferred that the filtration with the filter be performed in many stages or be repeated many times. At this time, circulation filtration in which the filtered liquid is repeatedly filtered may be performed. In addition, the filtration may be performed with a plurality of filters having different pore diameters. Specific examples of a method for the filtration with the filter include, but not limited to, normal-pressure filtration, pressure filtration, vacuum filtration, and the circulation filtration. Of those, the pressure filtration is preferably performed for filtering each of the curable compositions (α) at a flow rate within a certain range to reduce the number concentration (particles/mL) of particles, and the circulation filtration is more preferably performed for further sufficiently reducing the concentration.

When the pressure filtration is performed, it is preferred that the final fraction serving as a fraction after the amount of the raw material before the filtration (crude curable composition (α)) has become equal to or less than a predetermined amount be not recovered. When the amount of the raw material before the filtration becomes equal to or less than the predetermined amount, there is a high risk in that in the course of the delivery of the liquid, the liquid is delivered while involving its surrounding air. As a result, the liquid may contain a large amount of air bubbles such as nanobubbles. Accordingly, when not the circulation filtration but the pressure filtration is performed, a fraction except the first fraction and the final fraction is preferably recovered in a recovery container.

Figure 5A:
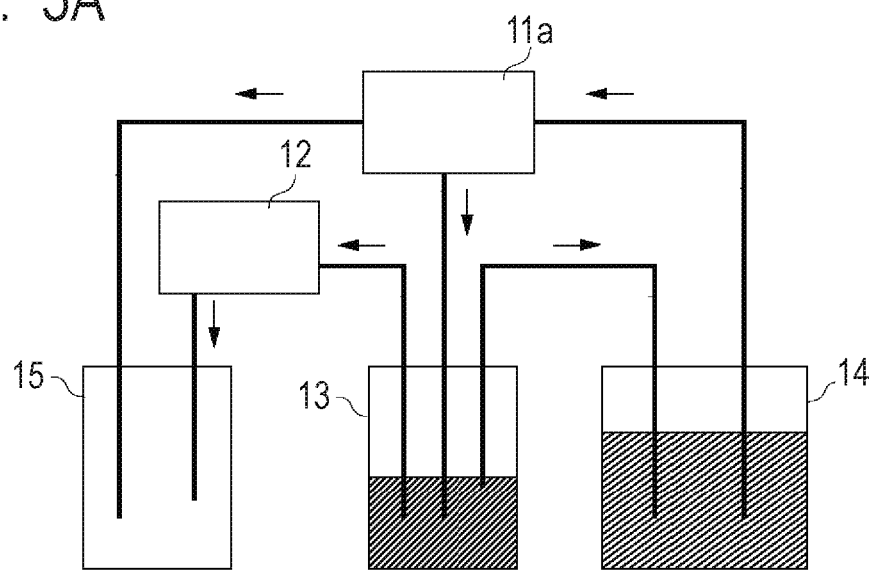
FIGS. 5A and 5B are each a view for schematically illustrating a purification system for curable compositions (a) in one embodiment of the present invention.
Figure 5B:
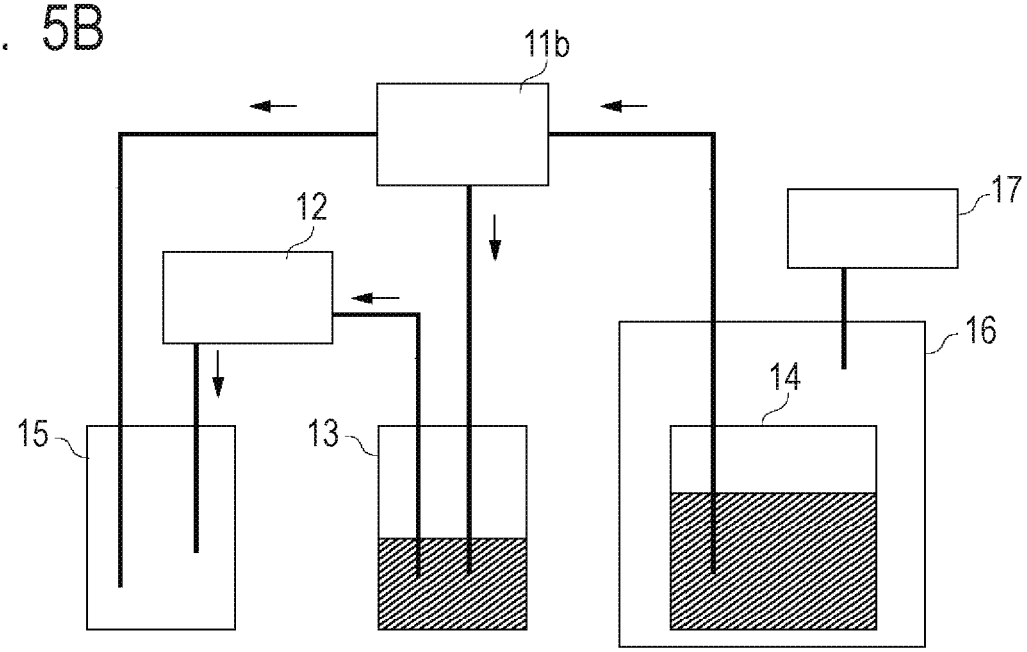

FIGS. 5A and 5B are each a view for schematically illustrating the construction of a purification system for the curable compositions (α) according to this embodiment. FIG. 5A is an illustration of a purification system based on the circulation filtration, and FIG. 5B is an illustration of a purification system based on the pressure filtration.

As illustrated in FIG. 5A, the purification system based on the circulation filtration according to this embodiment includes a purifying unit/liquid delivering unit 11a, a particle number concentration measuring unit (hereinafter referred to as "measuring unit 12"), a recovery container 13, a container 14, and a waste liquid container 15. In addition, as illustrated in FIG. 5B, the purification system based on the pressure filtration includes the purifying unit 11b, the measuring unit 12, the recovery container 13, the container 14, the waste liquid container 15, a pressure chamber 16, and a pressurizing unit (liquid delivering unit) 17.

The flow rate of the crude curable composition (α) in the particle removing step according to this embodiment is preferably less than 0.03 L/min. In addition, the flow rate is more preferably less than 0.02 L/min, particularly preferably less than 0.01 L/min. When the flow rate at which the crude curable composition (α) passes the filter at the time of the filtration is set to less than 0.03 L/min as described above, the occurrence of bubbles due to the passage of the crude curable composition (α) through the filter can be suppressed. When the flow rate at which the crude curable composition (α) passes the filter at the time of the filtration is set to less than 0.01 L/min, the risk of ignition to the crude curable composition (α) can be suppressed.

In addition, the pore diameter of the filter through which the crude curable composition (α) is passed in this embodiment is set to 50 nm or less. Thus, the number concentration (particles/mL) of the particles each having a particle diameter of 0.07 µm or more can be efficiently reduced.

In the purification system for the curable compositions (α) according to this embodiment, a member with which the (crude) curable composition (α) is brought into contact is, for example, the inner wall or lid of the recovery container 13 or the container 14, the inner wall of a pipe (tube), a nut to be connected to the pipe, a pump (liquid delivering unit 11a), or the filter. A material for any such member is not particularly limited as long as the material has chemical resistance. However, the material for, and the degree of cleanliness of, any such member are preferably such that when the member is brought into contact with the (crude) curable composition (α), its contamination with, for example, impurities such as particles, metal impurities, and organic impurities, does not occur.

A container having a particularly high degree of cleanliness needs to be used as the recovery container 13 in which each of the curable compositions (α) purified in the purification system according to this embodiment is recovered out of the members. For example, a commercial class 100 polypropylene bottle can be used as the recovery container 13. However, the recovery container is not limited thereto, and a bottle whose inside is washed with an organic solvent or an acid, and is then sufficiently dried may be used, or the bottle may be used after having been prewashed with the curable composition (α).

In the purification system for the curable compositions (α) according to this embodiment, the recovery container 13 for recovering the target fraction (each of the curable compositions (α) after the purification) is preferably arranged in the line of the purification system in an in-line manner. Thus, the occurrence of new impurities such as nanobubbles, in the curable composition (α) can be suppressed.

The curable compositions (α) after the purification are each obtained by performing the circulation filtration through a predetermined number of times of circulation of the composition or through the circulation of a predetermined amount thereof. After that, the number concentration of the particles is measured with the measuring unit 12 connected to the recovery container 13. When the number concentration of the particles satisfies a predetermined value, the filtration is completed, and when the concentration does not satisfy the predetermined value, the filtration may be continued.

Through such purifying step (particle removing step), the number of impurities such as particles, included in each of the curable compositions (α) can be reduced. Thus, a reduction in yield of the SST-NIL process caused by the particles can be suppressed.

When the curable compositions (α) according to this embodiment are used for the manufacture of a semiconductor integrated circuit, it is preferred to avoid the mixing of metal atom-containing impurities (metal impurities) in the curable compositions (α) to the extent possible in order to prevent the operation of a product from being inhibited.

Therefore, each of the curable compositions (α) is preferably prevented from being brought into contact with a metal in its production process. That is, it is preferred that a weighing instrument, container, or the like made of a metal be not used when the respective materials are weighed or when the materials are blended and stirred. In addition, filtration with a metal impurity removing filter may be further performed in the purifying step (particle removing step).

A filter made of, for example, cellulose and diatomaceous earth, or of an ion exchange resin can be used as the metal impurity removing filter, but the filter is not particularly limited. For example, "Zeta Plus GN Grade" or "Electropor" (each of which are manufactured by Sumitomo 3M Limited), "Posidyne", "IonKleen AN", or "IonKleen SL" (all of which are manufactured by Nihon Pall Ltd.), or "Protego" (manufactured by Nihon Entegris K.K.) can be used as the metal impurity removing filter. Each of the metal impurity removing filters may be used alone, or two or more kinds thereof may be used in combination.

Any such metal impurity removing filter is preferably used after having been washed. A method for the washing is preferably as follows: washing with ultrapure water, washing with an alcohol, and prewashing with each of the curable compositions (α) are performed in the stated order.

The pore diameter of the metal impurity removing filter is, for example, suitably 0.001 μm or more and 5.0 μm or less, preferably 0.003 μm or more and 0.01 μm or less. When the pore diameter is more than 5.0 μm, the ability of the filter to adsorb particles and metal impurities is low. In addition, when the pore diameter is less than 0.001 μm, the filter traps even a constituent component for each of the curable compositions (α), and hence the composition of the curable composition (α) may be fluctuated or the clogging of the filter may occur.

In this case, the concentration of the metal impurities in the curable compositions (α) is preferably 10 ppm or less, more preferably 100 ppb or less.

[Cured Film]

A cured product is obtained by curing the curable compositions (α) according to this embodiment. At this time, the following is preferably performed: the curable compositions (α) are applied onto a base material to form an applied film, and then the film is cured to provide a cured film. A method of forming the applied film, and a method of forming the cured product or the cured film are described later.

[Method of Forming Cured Product Pattern]

Next, a method of forming a cured product pattern in which the cured product pattern is formed by using the curable compositions (α) according to this embodiment is described with reference to the schematic sectional views of FIGS. 2A through 2G.

The method of forming a cured product pattern according to this embodiment includes:

(1) the first step (arranging step) of arranging the curable composition (α1) 202 on a substrate 201;

(2) the second step (applying step) of applying droplets of the curable composition (α2) 203 discretely onto the layer of the curable composition (α1') 202' that is the components of the curable composition (α1) 202 except the component (D) serving as a solvent;

(3) the third step (mold contacting step) of bringing a mixture layer obtained by partially mixing the curable composition (α1') 202' that is the components of the curable composition (α1) 202 except the component (D) serving as a solvent and the curable composition (α2) 203 into contact with a mold 205 having a pattern;

(4) the fourth step (light irradiating step) of curing the mixture layer obtained by mixing the two kinds of curable compositions; and (5) the fifth step (releasing step) of releasing the mold 205 from the mixture layer obtained by mixing the two kinds of curable compositions after the curing.

The method of forming a cured product pattern according to this embodiment is a method of forming a cured product pattern involving utilizing a photo-nanoimprint method.

A cured film obtained by the method of forming a cured product pattern according to this embodiment is preferably a cured product pattern having a pattern having a size of 1 nm or more and 10 mm or less. In addition, the cured film is more preferably a cured product pattern having a pattern having a size of 10 nm or more and 100 μm or less. Particularly in the case of a semiconductor production application, the cured film is particularly preferably a cured product pattern having a pattern having a size of 4 nm or more and less than 30 nm. In general, a pattern forming technology for producing a film having a pattern (uneven structure) of a nanosize (1 nm or more and 100 nm or less) through the use of light is called a photo-nanoimprint method. The pattern forming method according to this embodiment uses the photo-nanoimprint method.

Each step is hereinafter described with reference to the schematic sectional views of FIGS. 2A through 2G and 3A through 3C.

<Arranging Step (1)>

Figure 2A:
FIGS. 2A, 2B, 2C, 2D, 2E, 2F, and 2G are schematic sectional views for illustrating a photo-nanoimprint technology according to one embodiment of the present invention.
Figure 2B:

In this step (arranging step (1)), as illustrated in FIGS. 2A and 2B, the curable composition (α1) 202 according to this embodiment described in the foregoing is arranged (applied) onto the substrate 201 to form an applied film serving as a pretreatment coating. In the case where the liquid film serving as a pretreatment coating is formed on the substrate 201, when the droplets of the curable composition (α2) 203 are applied in the applying step (2) to be described later, the spread of a droplet component in a substrate surface direction is promoted. The phrase "the spread is promoted" means that in the case where the droplets are applied onto the pretreatment coating, the droplets spread in the substrate surface direction at a speed faster than the speed of the spread of the droplets in the case where the droplets are directly applied onto the substrate 201. As a result, the droplets of the curable composition (α2) 203 dispensed dropwise discretely expand quickly on the liquid film of the curable composition (α1') 202' that is the components of the curable composition (α1) 202 except the component (D) serving as a solvent, and hence an imprint process having a short filling time and high throughput can be provided.

The substrate 201 on which the curable composition (α1) 202 serving as the component for the material for an imprint pretreatment coating is to be arranged is a substrate to be processed, and a silicon wafer is typically used. A layer to be processed may be formed on the substrate 201. Another layer may be further formed between the substrate 201 and the layer to be processed.

In this embodiment, however, the substrate 201 is not limited to the silicon wafer. The substrate 201 can be arbitrarily selected from substrates known as substrates for semiconductor devices such as aluminum, a titanium-tungsten alloy, an aluminum-silicon alloy, an aluminum-copper-silicon alloy, silicon oxide, and silicon nitride. In addition, when a quartz substrate is used as the substrate 201, a replica of a quartz imprint mold (quartz mold replica) can be produced. A substrate 201 improved in adhesiveness with each of the curable composition (α1') 202' that is the components of the curable composition (α1) 202 except the component (D) serving as a solvent and the curable composition (α2) 203 through the formation of an adhesion layer on to the upper surface of the substrate 201 by a surface treatment such as a silane coupling treatment, a silazane treatment, or the formation of an organic thin film, may be used as the substrate 201 (substrate to be processed) to be used.

In this embodiment, as a method of arranging the curable composition (α1) 202 serving as the component for the material for an imprint pretreatment coating on the substrate 201, there may be used, for example, an ink jet method, a dip coating method, an air knife coating method, a curtain coating method, a wire bar coating method, a gravure coating method, an extrusion coating method, a spin coating method, or a slit scan method. In this embodiment, a spin coating method is particularly preferred.

When the curable composition (α1) 202 is arranged on the substrate 201 or the layer to be processed by using the spin coating method, the solvent component (D) may be volatilized by performing a baking step as required. But, it is preferred that the solvent component (D) be volatilized without performing a baking step.

The average thickness of the curable composition (α1') 202' that is the components of the curable composition (α1) 202 except the component (D) serving as a solvent, which varies depending on applications where the composition is used, is, for example, 0.1 nm or more and 10,000 nm or less, preferably 1 nm or more and 20 nm or less, particularly preferably 1 nm or more and 10 nm or less.

Figure 2C:
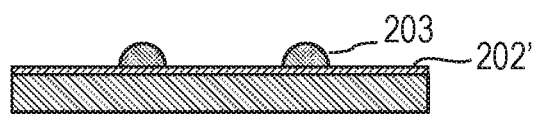

<Applying Step (2)>
In this step (applying step (2)), as illustrated in FIG. 2C, droplets of the curable composition (α2) 203 are preferably applied discretely onto the layer of the curable composition (α1') 202' as a pretreatment coating arranged on a substrate 201, the composition (α1') 202' is the components of the curable composition (α1) 202 except the component (D) serving as a solvent. The inkjet method is particularly preferred as a method for the application. The droplets of the curable composition (α2) 203 are densely arranged on the substrate 201 facing a region where groove portions are densely present on the mold 205, and are sparsely arranged on the substrate 201 facing a region where groove portions are sparsely present. Thus, the thickness of a remaining film to be described later can be controlled to a uniform value irrespective of the density of a pattern on the mold.

Figure 2D:
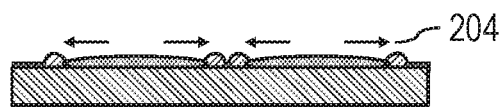

In the present invention, the droplets of the curable composition (α2) 203 applied in this step (applying step (2)) are quickly spread as indicated by arrows 204 showing the direction in which droplets spread by the Marangoni effect using a difference in surface energy (surface tension) as a driving force as described in the foregoing (prespread) (FIG. 2D).

Figure 2E:
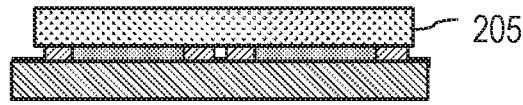

<Mold Contacting Step (3)>
Next, as illustrated in FIG. 2E, the mold 205 having a template pattern for transferring a pattern shape is brought into contact with a liquid obtained by partially mixing the curable composition (α1') 202' that is the components of the curable composition (α1) 202 except the component (D) serving as a solvent and the curable composition (α2) 203, the liquid being formed in the previous steps (arranging step (1) and applying step (2)). Thus, a groove portion of a fine pattern on the surface of the mold 205 is filled with the liquid obtained by partially mixing the curable composition (α1') 202' that is the components of the curable composition (α1) 202 except the component (D) serving as a solvent and the curable composition (α2) 203, and hence a liquid film filled into the fine pattern of the mold 205 is obtained.

After the completion of the previous step (applying step (2)) and before the initiation of this step, the positions/position of the mold and/or the substrate 201 (substrate to be processed) can be adjusted as required so that a registration mark on a mold 205 side and the registration mark of the substrate 201 (substrate to be processed) may coincide with each other (aligning step).

The mold 205 that is formed of an optically transparent material is desirably used as the mold 205 considering the next step (light irradiating step (4)). Preferred specific examples of the material for forming the mold 205 include: glass, quartz, an optically transparent resin such as PMMA or a polycarbonate resin, a transparent metal-deposited film, a flexible film made of polydimethylsiloxane or the like, a photocured film, and a metal film. In the case of using the optically transparent resin as the material for forming the mold 205, it is necessary to select a resin that does not dissolve in a component contained in each of the curable composition (α1') 202' that is the components of the curable composition (α1) 202 except the component (D) serving as a solvent and the curable composition (α2) 203. Quartz is particularly preferred as the material for forming the mold 205 because of its small thermal expansion coefficient and small pattern deformation.

The fine pattern on the surface of the mold 205 preferably has a pattern the width S of the groove portion of the groove/land pattern of 4 nm or more and less than 30 nm and the height H of 4 nm or more and 200 nm or less. In addition, the fine pattern on the surface of the mold 205 preferably has an aspect ratio the height H of the pattern with respect to the width L of the land portion of the groove/land pattern of 1 or more and 10 or less.

The mold 205 may be subjected to a surface treatment before this step, which is a mold contacting step of the curable composition (α1') 202' that is the components of the curable composition (α1) 202 except the component (D) serving as a solvent and the curable composition (α2) 203 and the mold 205, so as to enhance the releasability between the curable composition (α1') 202' that is the components of the curable composition (α1) 202 except the component (D) serving as a solvent and the curable composition (α2) 203 and the surface of the mold 205. As a method for the surface treatment, there is given a method involving forming a release agent layer by applying a release agent onto the surface of the mold 205. In this case, examples of the release agent to be applied onto the surface of the mold 205 include a silicon-based release agent, a fluorine-based release agent, a hydrocarbon-based release agent, a polyethylene-based release agent, a polypropylene-based release agent, a paraffin-based release agent, a montan-based release agent, and a carnauba-based release agent. For example, a commercially available application-type release agent such as OPTOOL DSX manufactured by Daikin Industries, Ltd. can be suitably used. One kind of the release agents may be used alone, or two or more kinds thereof may be used in combination. Of those, fluorine-based and hydrocarbon-based release agents are particularly preferred.

A pressure to be applied to the curable composition (α1') 202' that is the components of the curable composition (α1) 202 except the component (D) serving as a solvent and the curable composition (α2) 203 when the mold 205 and the curable composition (α1') 202' that is the components of the curable composition (α1) 202 except the component (D) serving as a solvent and the curable composition (α2) 203 are brought into contact with each other in this step (mold contacting step (3)) as illustrated in FIG. 2E is not particularly limited. The pressure is desirably set to 0 MPa or more and 100 MPa or less. In addition, the pressure is preferably 0 MPa or more and 50 MPa or less, more preferably 0 MPa or more and 30 MPa or less, still more preferably 0 MPa or more and 20 MPa or less.

In the present invention, the prespread of the droplets of the curable composition (α2) 203 has progressed in the previous step (applying step (2)), and hence the spread of the curable composition (α2) 203 in this step is quickly completed. In a boundary region between the droplets of the curable composition (α2) 203, the spread is finally completed and the concentration of the curable composition (α1') 202' that is the components of the curable composition (α1) 202 except the component (D) serving as a solvent is high.

As described above, the spread and fill of the curable composition (α1') 202' that is the components of the curable composition (α1) 202 except the component (D) serving as a solvent and the curable composition (α2) 203 are quickly completed in this step, and hence the time period for which the mold 205, and the curable composition (α1') 202' that is the components of the curable composition (α1) 202 except the component (D) serving as a solvent and the curable composition (α2) 203 are brought into contact with each other can be set to be short. In other words, one of the effects of the present invention is as follows: many pattern forming steps can be completed within a short time period, and hence high productivity is obtained. The time period for which the mold and the compositions are brought into contact with each other, which is not particularly limited, is desirably set to, for example, 0.1 second or more and 600 seconds or less. In addition, the time period is preferably 0.1 second or more and 3 seconds or less, particularly preferably 0.1 second or more and 1 second or less. When the time period is shorter than 0.1 second, the following tendency is observed: the spread and the fill become insufficient, and hence many defects called nonfill defects occur.

The average thickness of each of the curable composition (α1') 202' that is the components of the curable composition (α1) 202 except the component (D) serving as a solvent and the curable composition (α2) 203 (layer onto which a shape is to be transferred) at the time of the completion of the spread and the fill, which varies depending on applications where the cured product pattern is used, is, for example, 0.001 μm or more and 100.0 μm or less.

At this time, when the curable composition (α1) 202 having a number concentration (particles/mL) of the particles each having a particle diameter of 0.07 or more incorporated therein of less than 2,021 particles/mL, the composition serving as one kind of the curable compositions (α) according to this embodiment, is used, the breakage of the mold 205 due to the particles can be suppressed. In addition, a pattern defect of the cured product pattern to be obtained can be suppressed. As a result, a reduction in yield of the SST-NIL process can be suppressed.

In addition, when the curable composition (α2) 203 having a number concentration (particles/mL) of the particles each having a particle diameter of 0.07 or more incorporated therein of less than 471 particles/mL, the composition serving as one kind of the curable compositions (α) according to this embodiment, is used, the breakage of the mold 205 due to the particles can be suppressed. In addition, a pattern defect of the cured product pattern to be obtained can be suppressed. As a result, a reduction in yield of the SST-NIL process can be suppressed.

Further, when both the curable composition (α1) 202 having a number concentration (particles/mL) of the particles each having a particle diameter of 0.07 or more incorporated therein of less than 2,021 particles/mL, and the curable composition (α2) 203 having a number concentration (particles/mL) of the particles each having a particle diameter of 0.07 μm or more incorporated therein of less than 471 particles/mL are used, the breakage of the mold 205 due to the particles can be further suppressed. In addition, the pattern defect of the cured product pattern to be obtained can be further suppressed. As a result, the reduction in yield of the SST-NIL process can be further suppressed.

This step can be performed under any condition of an air atmosphere, a reduced pressure atmosphere, and an inert gas atmosphere. Of those atmospheres, a reduced pressure atmosphere or an inert gas atmosphere is preferred because an influence of oxygen or moisture on a curing reaction can be prevented. When this step is performed under an inert gas atmosphere, specific examples of the inert gas that can be used include nitrogen, carbon dioxide, helium, argon, various fluorocarbon gases, and a mixed gas thereof. A preferred pressure when this step is performed under a particular gas atmosphere including an air atmosphere is 0.0001 atm or more and 10 atm or less.

The mold contacting step may be performed under an atmosphere containing a condensable gas (hereinafter referred to as "condensable gas atmosphere"). The term "condensable gas" as used herein refers to the following gas: when the gas in the atmosphere is filled into a groove portion of the fine pattern formed on the mold 205, and the gap between the mold 205 and the substrate 201 together with the curable composition (α1') 202' that is the components of the curable composition (α1) 202 except the component (D) serving as a solvent and the curable composition (α2) 203, the gas is condensed by a capillary pressure generated at the time of the filling to liquefy. The condensable gas is present as a gas in the atmosphere before the curable composition (α1') 202' that is the components of the curable composition (α1) 202 except the component (D) serving as a solvent and the curable composition (α2) 203, and the mold 205 are brought into contact with each other in the mold contacting step (FIGS. 2C and 2D).

When the mold contacting step is performed under the condensable gas atmosphere, the gas filled into a groove portion of the fine pattern is liquefied, and hence air bubbles disappear. Accordingly, a filling property becomes excellent. The condensable gas may dissolve in the curable composition (α1') 202' that is the components of the curable composition (α1) 202 except the component (D) serving as a solvent and/or the curable composition (α2) 203.

The boiling point of the condensable gas, which is not limited as long as the boiling point is equal to or less than the ambient temperature of the mold contacting step, is preferably from −10° C. to 23° C., more preferably from 10° C. to 23° C. When the boiling point falls within the range, the filling property is more excellent.

The vapor pressure of the condensable gas at the ambient temperature in the mold contacting step, which is not limited as long as the vapor pressure is equal to or less than a mold pressure to be applied to the curable composition (α1') 202' that is the components of the curable composition (α1) 202 except the component (D) serving as a solvent and the curable composition (α2) 203 when impression is performed in the mold contacting step, i.e. when the mold 205 and the curable composition (α1') 202' that is the components of the curable composition (α1) 202 except the component (D) serving as a solvent and the curable composition (α2) 203 are brought into contact with each other is preferably from 0.1 MPa to 0.4 MPa. When the vapor pressure falls within the range, the filling property is more excellent. When the vapor pressure at the ambient temperature is more than 0.4 MPa, the following tendency is observed: an air bubble disappearing effect cannot be sufficiently obtained. On the other hand, when the vapor pressure at the ambient temperature is less than 0.1 MPa, the following tendency is observed: decompression is needed and hence an apparatus becomes complicated.

The ambient temperature in the mold contacting step, which is not particularly limited, is preferably from 20° C. to 25° C.

Specific examples of the condensable gas include fluorocarbons such as: a chlorofluorocarbon (CFC) such as trichlorofluoromethane; a fluorocarbon (FC); a hydrochlorofluorocarbon (HCFC); a hydrofluorocarbon (HFC) such as 1,1,1,3,3-pentafluoropropane ($CHF_2CH_2CF_3$, HFC-245fa, PFP); and a hydrofluoroether (HFE) such as pentafluoroethyl methyl ether ($CF_3CF_2OCH_3$, HFE-245mc).

Of those, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from such a viewpoint that when the ambient temperature in the mold contacting step is from 20° C. to 25° C., the filling property is excellent. Further, 1,1,1,3,3-pentafluoropropane is particularly preferred from the viewpoint of being excellent in safety.

One kind of the condensable gases may be used alone, or two or more kinds thereof may be used as a mixture. In addition, any such condensable gas may be mixed with a non-condensable gas such as air, nitrogen, carbon dioxide, helium, or argon, before use. The non-condensable gas with which the condensable gas is mixed is preferably helium from the viewpoint of the filling property. Helium can permeate the mold 205. Accordingly, when the gases (the condensable gas and helium) in the atmosphere are filled into a groove portion of the fine pattern formed on the mold 205 in the mold contacting step together with the curable composition (α1') 202' that is the components of the curable composition (α1) 202 except the component (D) serving as a solvent and/or the curable composition (α2) 203, the condensable gas liquefies and helium permeates the mold 205.

<Light Irradiating Step (4)>

Figure 2F:
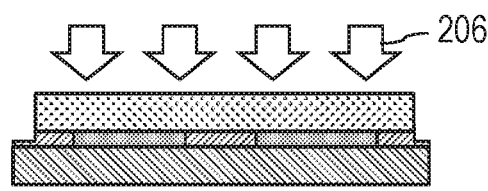

Next, as illustrated in FIG. 2F, a mixture layer obtained by partially mixing the curable composition (α1') 202' that is the components of the curable composition (α1) 202 except the component (D) serving as a solvent and the curable composition (α2) 203 is irradiated with irradiation light 206 through the mold 205. In more detail, the curable composition (α1') 202' that is the components of the curable composition (α1) 202 except the component (D) serving as a solvent and/or the curable composition (α2) 203 filled into the fine pattern of the mold 205 are/is irradiated with the irradiation light 206 through the mold 205. Thus, the curable composition (α1') 202' that is the components of the curable composition (α1) 202 except the component (D) serving as a solvent and/or the curable composition (α2) 203 filled into the fine pattern of the mold 205 are/is cured by the irradiation light 206 to become the cured film 207 having a pattern shape.

In this case, the irradiation light 206 with which the curable composition (α1') 202' that is the components of the curable composition (α1) 202 except the component (D) serving as a solvent and the curable composition (α2) 203 each constituting the layer onto which a shape is to be transferred filled into the fine pattern of the mold 205 are irradiated is selected depending on the sensitive wavelengths of the curable composition (α1') 202' that is the components of the curable composition (α1) 202 except the component (D) serving as a solvent and the curable composition (α2) 203. Specifically, it is preferred that UV light having a wavelength of 150 nm or more and 400 nm or less, an X-ray, an electron beam, or the like be appropriately selected and used.

Of those, the irradiation light 206 with which the curable composition (α1') 202' that is the components of the curable composition (α1) 202 except the component (D) serving as a solvent and the curable composition (α2) 203 are irradiated is particularly preferably UV light. This is because many of the compounds commercially available as curing aids (photopolymerization initiators) have sensitivity to UV light. In this case, examples of the light source of UV light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. In addition, the number of the light sources to be used may be one or two or more. Further, the entire surface of the layer onto which a shape is to be transferred (curable composition (α1') 202' that is the components of the curable composition (α1) 202 except the component (D) serving as a solvent and curable composition (α2) 203) filled into the fine pattern of the mold 205 may be irradiated with light, or a part of the surface thereof may be irradiated with light.

In addition, the light irradiation may be performed on an entire region on the substrate 201 intermittently a plurality of times, or may be continuously performed on the entire region. Further, the following may be performed: a partial region A is irradiated with the light in a first irradiating process, and a region B different from the region A is irradiated with the light in a second irradiating process.

<Releasing Step (5)>

Next, the mold 205 is released from the cured film 207 having a pattern shape.

In this step (releasing step (5)), as illustrated in FIG. 2Q the mold 205 is released from the cured film 207 having a pattern shape, and hence the cured film 207 having a pattern shape serving as the reverse pattern of the fine pattern formed in the step (4) (light irradiating step) on the mold 205 is obtained. A cured film remains in a groove portion of the grove/land pattern of the cured film 207 having a pattern shape, and the film is called a remaining film 303 (see, FIG. 3A).

When the step (3) (mold contacting step) is performed under the condensable gas atmosphere, the condensable gas vaporizes in association with a reduction in pressure of the interface at which the cured film 207 having a pattern shape and the mold 205 are in contact with each other at the time of the release of the cured film 207 having a pattern shape and the mold 205 in the step (5) (releasing step). Thus, a reducing effect on the release force serving as a force needed for releasing the cured film 207 having a pattern shape and the mold 205 from each other tends to be exhibited.

A method of releasing the cured film 207 having a pattern shape and the mold 205 from each other is not particularly limited as long as part of the cured film 207 having a pattern shape is not physically damaged at the time of the release, and various conditions and the like are also not particularly limited. For example, the following may be performed: the substrate 201 (substrate to be processed) is fixed and the mold 205 is peeled by being moved so as to recede from the substrate 201. Alternatively, the following may be performed: the mold 205 is fixed and the substrate 201 is peeled by being moved so as to recede from the mold 205. Alternatively, both the substrate 201 and the mold 205 may be peeled from each other by being pulled in directions diametrically opposite to each other.

A cured film 207 having a desired groove/land pattern shape (pattern shape associated with the groove/land shape of the mold 205) at a desired position can be obtained by a series of steps (production process) including the step (1) to the step (5). The resultant cured film 207 having a pattern shape can be utilized not only in a semiconductor processing application to be described later but also as, for example, an optical member such as a Fresnel lens or a diffraction grating (the case where the film is used as one member of the optical member is included). In such case, an optical member including at least the substrate 201 and the cured film 207 arranged on the substrate 201, the film having a pattern shape, can be obtained.

The method of producing a film having a pattern shape of this embodiment enables the following: the curable composition (α1) 202 is collectively arranged on most of the surface of the substrate in the step (1), and a repeating unit (shot) including the step (2) to the step (5) is repeatedly performed on the same substrate a plurality of times. In addition, the step (1) to the step (5) may be repeatedly performed on the same substrate a plurality of times. When the repeating unit (shot) including the step (1) to the step (5) or of the step (2) to the step (5) is repeated a plurality of times, a cured film 207 having a plurality of desired groove/land pattern shapes (pattern shapes associated with the groove/land shape of the mold 205) at desired positions of the substrate 201 (substrate to be processed) can be obtained.

<Remaining Film Removing Step (6) of Removing Part of Cured Film>

Figure 2G:
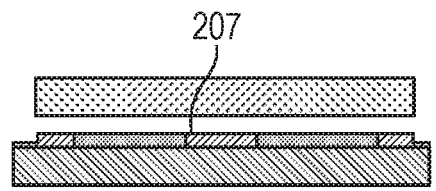
Figure 3A:
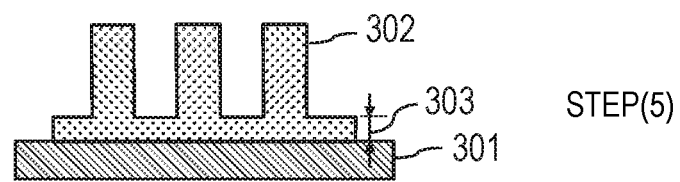
FIGS. 3A, 3B, and 3C are schematic sectional views for illustrating a remaining film removing step in one embodiment of the present invention.
Figure 3B:
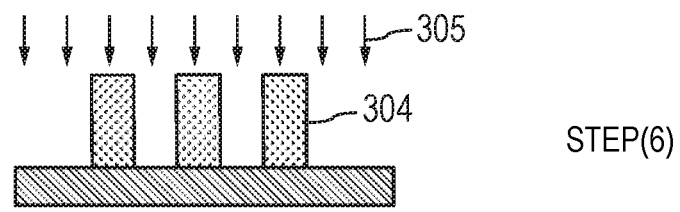
Figure 3C:
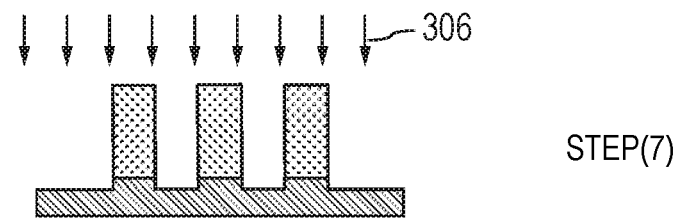

The cured film 207 having a pattern shape obtained by the releasing step (5) has a specific pattern shape, but as illustrated in FIG. 3A, part of a remaining film 303 may remain in a region except a region where the pattern shape is formed as well. In such case, as illustrated in FIG. 3B, the cured film (remaining film 303) in the region to be removed out of a cured film 302 having a pattern shape thus obtained is removed with, for example, an etching gas A 305 (FIG. 3B). Thus, a cured film pattern 304 having a desired groove/land pattern shape (pattern shape associated with the groove/land shape of the mold 205 of FIGS. 2A through 2G) and free of a remaining film 303 (a desired portion of the surface of a substrate 301 is exposed) can be obtained.

A method of removing the remaining film 303 is, for example, a method involving removing the cured film (remaining film 303) serving as a groove portion of the cured film 302 having a pattern shape by a method such as etching to expose the surface of the substrate 301 in the groove portion of the pattern of the cured film 302 having a pattern shape.

When the remaining film 303 present in the groove portion of the cured film 302 having a pattern shape is removed by etching, a specific method therefor is not particularly limited, and a conventionally known method, e.g., dry etching involving using the etching gas A 305 (FIG. 3B) can be used. A conventionally known dry etching apparatus can be used in the dry etching. In addition, the etching gas A 305 is appropriately selected in accordance with the elemental composition of the cured film 302 to be subjected to the etching, and for example, a halogen-based gas such as $CF_4$, $C_2F_6$, $C_3F_8$, $CCl_2F_2$, $CCl_4$, $CBrF_3$, $BCl_3$, $PCl_3$, $SF_6$, or $Cl_2$, a gas containing an oxygen atom such as $O_2$, CO, or $CO_2$, an inert gas such as He, $N_2$, or Ar, or a $H_2$ or $NH_3$ gas can be used. Two or more kinds of those gases can also be used as a mixture.

When the substrate 301 (substrate to be processed) to be used is a substrate 301 improved in adhesiveness with the cured film 302 having a pattern shape by a surface treatment such as a silane coupling treatment, a silazane treatment, or the formation of an organic thin film, the surface-treated layer can also be removed by etching subsequently to the etching of the cured film (remaining film 303) present in the groove portion of the cured film 302 having a pattern shape.

The cured film pattern 304 that has a desired groove/land pattern shape (pattern shape associated with the groove/land shape of the mold 205) at a desired position, and that is free of a remaining film 303 can be obtained by the foregoing production process including the step (1) to the step (6), and hence an article having a cured film pattern 304 can be obtained. Further, when the substrate 301 is processed by utilizing the resultant cured film pattern 304 free of a remaining film 303, a substrate 301 processing step (step (7)) to be described later is performed.

Meanwhile, the resultant cured film pattern 304 free of a remaining film 303 can be utilized not only in the semiconductor processing application to be described later but also as, for example, an optical member such as a diffraction grating or a polarizing plate (the case where the pattern is used as one member of the optical member is included), to provide an optical component. In such case, an optical component including at least the substrate 301 and the cured film pattern 304 free of a remaining film 303 arranged on the substrate 301 can be obtained.

<Substrate Processing Step (7)>

After the remaining film removing step (6), part of the substrate 301 whose surface has been exposed in the step (6) is subjected to dry etching by utilizing the cured film pattern 304 free of a remaining film 303 as a resist film. A conventionally known dry etching apparatus can be used in the dry etching. In addition, the etching gas B 306 (FIG. 3C) is appropriately selected in accordance with the elemental composition of the cured film 302 to be subjected to the etching and the elemental composition of the substrate 301 to be subjected to the etching, and for example, a halogen-based gas such as $CF_4$, $C_2F_6$, $C_3F_8$, $CCl_2F_2$, $CCl_4$, $CBrF_3$, $BCl_3$, $PCl_3$, $SF_6$, or $Cl_2$, a gas containing an oxygen atom such as $O_2$, CO, or $CO_2$, an inert gas such as He, $N_2$, or Ar, or a $H_2$ or $NH_3$ gas can be used. Two or more kinds of those gases can also be used as a mixture. The etching gas A 305 (FIG. 3B) and the etching gas B 306 (FIG. 3C) may be identical to or different from each other.

As illustrated in FIG. 2G, the nonuniformity of the concentrations of the curable composition (α1') 202' that is the components of the curable composition (α1) 202 except the component (D) serving as a solvent and the curable composition (α2) 203 may occur in the cured film 207 having a pattern shape. The curable composition (α1') 202' that is the components of the curable composition (α1) 202 except the component (D) serving as a solvent according to this embodiment has dry etching resistance equal to or higher than that of the curable composition (α2) 203. Accordingly, even in a region having a high concentration of the curable composition (α1') 202' that is the components of the curable composition (α1) 202 except the component (D) serving as a solvent, the substrate 301 can be satisfactorily processed, and as a result, the substrate 301 can be uniformly processed.

A circuit structure based on a pattern shape associated with the groove/land shape of the mold 205 can be formed on the substrate 301 by forming an electronic component in addition to the foregoing series of steps (production process) including the steps (1) to (7). Thus, a circuit board to be utilized in a semiconductor element or the like can be produced. Examples of the semiconductor element as used herein include an LSI, a system LSI, a DRAM, an SDRAM, an RDRAM, a D-RDRAM, and a NAND flash. In addition, an electronic instrument such as a display, a camera, or a medical apparatus, can be formed by connecting the circuit board and, for example, a circuit control mechanism for a circuit board.

In addition, similarly, an optical component can be obtained by processing the substrate 301 by dry etching through the utilization of the cured product pattern 304 free of a remaining film 303 as a resist film.

In addition, a replica of a quartz imprint mold (quartz replica mold) can be produced by: using a quartz substrate as the substrate 301; and processing quartz by dry etching through the utilization of the cured product pattern 304 free of a remaining film 303 as a resist film.

When a substrate with a circuit or an electronic component is produced, the cured product pattern 304 free of a remaining film 303 may be finally removed from the processed substrate 301, but a construction in which the pattern is left as a member constituting any such element may be adopted.

EXAMPLES

The present invention is hereinafter described in more detail by way of Examples, but the technical scope of the present invention is not limited to Examples to be described below.

Preparation of Curable Composition (α1) and Curable Composition (α2)

Example 1

(1) Preparation of Curable Composition (α1-1)

A component (A), a component (B), a component (C), and a component (D) described below were blended, and the blend was subjected to circulation filtration with an ion filter, a 10-nanometer nylon filter, and a 5-nanometer HDPE filter. The circulation filtration was performed for a time period corresponding to about 8 passes (the time period is equal to a liquid delivering period that eight times volume of the filtrate is processed) to prepare a curable composition (α1-1) of Example 1.

| | |
|---|---|
| (1-1) Component (A): | 100 parts by weight in total |
| <A-1> 1,12-Dodecanediol diacrylate (manufactured by Wanda Science): | 100 parts by weight |
| (1-2) Component (B): | 0 parts by weight in total |
| The component (B) was not added. | |
| (1-3) Component (C): | 0 parts by weight in total |
| The component (C) was not added. | |
| (1-4) Component (D): | 33,000 parts by weight in total |
| Propylene glycol monomethyl ether acetate (manufactured by Tokyo Chemical Industry Co., Ltd., abbreviation: PGMEA): | 33,000 parts by weight |

(2) Measurement of Number Concentration of Particles in Curable Composition (α1-1)

The number concentration of particles in the prepared curable composition (α1-1) was measured with a liquid-borne particle sensor KS-18F (manufactured by Rion Co., Ltd.). In addition, a controller KE-40B1 (manufactured by Rion Co., Ltd.) and a syringe sampler KZ-30W1 (manufactured by Rion Co., Ltd.) were used in combination therewith. 15 Milliliters of the curable composition (α1-1) was delivered by driving the syringe sampler, and was passed through the inside of the measuring cell of the liquid-borne particle sensor at a flow rate of 10 mL/min. Thus, the number concentration of particles each having a particle diameter of 0.07 μm or more in the curable composition (α1-1) was measured. The average of the number concentrations obtained by repeatedly performing the measurement twice was determined, and was defined as the number concentration (average) of the particles each having a particle diameter of 0.07 μm or more. The number concentration (average) of the particles each having a particle diameter of 0.07 μm or more in the curable composition (α1-1) was 21.5 particles/mL.

All the measurements of the number concentrations of the particles herein were performed after the light scattering-type LPC had been calibrated in advance with polystyrene latex (PSL) standard particles each having a known particle diameter, the particles being dispersed in pure water. In addition, immediately after the measurement, software KF-50A for pulse-height analysis (manufactured by Rion Co., Ltd.) was used to confirm that the accuracy of a measured value for the number concentration of the particles each having a particle diameter of 0.07 μm or more was sufficiently secured. Specifically, the following was performed: a ratio (s/n) between the voltage value s of an element for receiving the scattered light of an aqueous solution of 0.07-micrometer PSL particles and the voltage value n of an element for receiving the scattered light of a liquid to be measured was determined, and the fact that the ratio was much larger than 1.3 was confirmed.

Example 2

(1) Preparation of Curable Composition (α1-2)

A curable composition (α1-2) was prepared in the same manner as in Example 1 except that the component (A) was changed to 30 parts by weight of <A-1>1,12-dodecanediol diacrylate (manufactured by Wanda Science) and 70 parts by weight of <A-2> dimethyloltricyclodecane diacrylate (manufactured by Sartomer, trade name: SR833s).

(2) Measurement of Number Concentration of Particles in Curable Composition (α1-2)

The number concentration of particles was measured in the same manner as in Example 1. The number concentration (average) of particles each having a particle diameter of 0.07 μm or more in the curable composition (α1-2) was 36.5 particles/mL.

Example 3

(1) Preparation of Curable Composition (α2-1)

A component (A), a component (B), a component (C), and a component (D) described below were blended, and the blend was subjected to circulation filtration with an ion filter, a 10-nanometer nylon filter, and a 5-nanometer HDPE filter. The circulation filtration was performed for a time period corresponding to about 8 passes to prepare a curable composition (α2-1) of Example 3.

| | |
|---|---|
| (1-1) Component (A): | 94 parts by weight in total |
| <A-1> Isobornyl acrylate (manufactured by Kyoeisha Chemical Co., Ltd., trade name: IB-XA): | 9.0 parts by weight |
| <A-2> Benzyl acrylate (manufactured by Osaka Organic Chemical Industry Ltd., trade name: V#160): | 38.0 parts by weight |
| <A-3> Neopentyl glycol diacrylate (manufactured by Kyoeisha Chemical Co., Ltd., trade name: NP-A): | 47.0 parts by weight |
| (1-2) Component (B): | 3 parts by weight in total |
| <B-1> Lucirin TPO (manufactured by BASF): | 3 parts by weight |
| (1-3) Component (C): | 2.1 parts by weight in total |
| <C-1> SR-730 (manufactured by Aoki Oil Industrial Co., Ltd.): | 1.6 parts by weight |
| <C-2> 4,4'-Bis(diethyl-amino)benzophenone (manufactured by Tokyo Chemical Industry Co., Ltd.): | 0.5 part by weight |
| (1-4) Component (D): The component (D) was not added. | 0 parts by weight in total |

(2) Measurement of Number Concentration of Particles in Curable Composition (α2-1)

The number concentration of particles in the prepared curable composition (α2-1) was measured with a liquid-borne particle sensor KS-41B (with an option capable of corresponding to a particle diameter as small as 0.07 μm, manufactured by Rion Co., Ltd.). In addition, a controller KE-40B1 (manufactured by Rion Co., Ltd.) and a syringe sampler KZ-30W1 (manufactured by Rion Co., Ltd.) were used in combination therewith. Ten milliliters of the curable composition (α2-1) was delivered by driving the syringe sampler, and was passed through the inside of the measuring cell of the liquid-borne particle sensor at a flow rate of 5 mL/min. Thus, the number concentration of particles each having a particle diameter of 0.07 μm or more in the curable composition (α2-1) was measured. The average of the number concentrations obtained by repeatedly performing the measurement three times was determined, and was defined as the number concentration (average) of the particles each having a particle diameter of 0.07 μm or more. The number concentration (average) of the particles each having a particle diameter of 0.07 μm or more in the curable composition (α2-1) was 99.9 particles/mL.

Comparative Example 1

(1) Preparation of Curable Composition (α1-1β)

The same component (A), component (B), component (C), and component (D) as those of Example 1 were blended to prepare a curable composition (α1-1β) of Comparative Example 1. Such circulation filtration as that of Example 1 was not performed.

(2) Measurement of Number Concentration of Particles in Curable Composition (α1-1β)

The number concentration of particles in the curable composition (α1-1β) in this comparative example is assumed to be extremely high because the composition is not subjected to a purifying step such as filtration. When the number concentration of the particles in such curable composition (α1-1β) is measured, there is a high risk in that the measuring cell or flow path of a liquid-borne particle sensor is remarkably contaminated with the particles. Accordingly, the measurement of the number concentration of the particles in the curable composition (α1-1β) was not performed.

However, as described later, the number concentration (average) of particles each having a particle diameter of 0.07 μm or more in a curable composition (α2-1β) before pressure filtration was equal to or more than the maximum rated particle number concentration of the used liquid-borne particle sensor (9,600 particles/mL). Accordingly, the number concentration of particles each having a particle diameter of 0.07 μm or more in the curable composition (α1-1β) may be 9,600 particles/mL or more.

Comparative Example 2

(1) Preparation of Curable Composition (α1-2β)

The same component (A), component (B), component (C), and component (D) as those of Example 2 were blended to prepare a curable composition (α1-2β) of Comparative Example 2. Such circulation filtration as that of Example 2 was not performed.

(2) Measurement of Number Concentration of Particles in Curable Composition (α1-2β)

The number concentration of particles in the curable composition (α1-2β) in this comparative example is assumed to be extremely high because the composition is not subjected to a purifying step such as filtration. When the number concentration of the particles in such curable composition (α1-2β) is measured, there is a high risk in that the measuring cell or flow path of a liquid-borne particle sensor is remarkably contaminated with the particles. Accordingly, the measurement of the number concentration of the particles in the curable composition (α1-2β) was not performed.

However, as described later, the number concentration (average) of particles each having a particle diameter of 0.07

μm or more in a curable composition (α2-1β) before pressure filtration was equal to or more than the maximum rated particle number concentration of the used liquid-borne particle sensor (9,600 particles/mL). Accordingly, the number concentration of particles each having a particle diameter of 0.07 μm or more in the curable composition (α1-2β) may be 9,600 particles/mL or more.

Comparative Example 3

(1) Preparation of Curable Composition (α2-1β)

The same component (A), component (B), component (C), and component (D) as those of Example 3 were blended, and the blend was subjected to pressure filtration with a filter having a pore diameter of 5 nm (Optimizer D300, manufactured by Nihon Entegris K.K.) to prepare the curable composition (α2-1β) of Comparative Example 3.

(2) Measurement of Number Concentration of Particles in Curable Composition (α2-1β)

The number concentration of particles was measured in the same manner as in Example 3. As a result, the number concentration (average) of particles each having a particle diameter of 0.07 μm or more in the curable composition (α2-1β) was 616 particles/mL. In addition, the number concentration (average) of the particles each having a particle diameter of 0.07 μm or more before the pressure filtration was equal to or more than the maximum rated particle number concentration of the used liquid-borne particle sensor (9,600 particles/mL).

Photo-Nanoimprint Using of Curable Composition (α1) and Curable Composition (α2)

Example 4

A film of the curable composition (α1'-1) having a thickness of about 7 nm can be obtained by applying the curable composition (α1-1) onto a silicon wafer having a diameter of 450 nm with a spin coater. In the process, solvent component (D) is volatilized. Accordingly, the curable composition (α1-1) is converted to the curable composition (α1'-1) that is the components of the curable composition (α1-1) except the solvent component (D).

One-picoliter droplets of the curable composition (α2-1) can be arranged discretely on the film of the curable composition (α1-1') by using an inkjet method. A droplet amount is set to, for example, such an amount that the average thickness of a cured film which is a photocured film of the mixture of the curable composition (α1-1') and the curable composition (α2-1) becomes about 37 nm. At this time, the surface tension of the curable composition (α1-1') arranged in the lower layer is higher than the surface tension of the curable composition (α2-1) dispensed dropwise in the upper layer, and hence the Marangoni effect is expressed and the expansion (prespread) of the droplets of the curable composition (α2-1) is quick. The surface tension of the curable composition (α1-1') that is the components of the curable composition (α1-1) except the solvent component (D) and the curable composition (α2-1) were measured as described later.

In addition, a mold not surface-treated having a line and space (L/S) pattern in which the width S of the groove portion of the mold is 28 nm, the width S of the land portion of the mold is 28 nm, and the height H is 60 nm is brought into contact with a liquid film of the mixture of the curable composition (α1'-1) and the curable composition (α2-1). In this case, the number concentration (average) of particles each having a particle diameter of 0.07 μm or more in the curable composition (α1-1) was 21.5 particles/mL and the number concentration (average) of particles each having a particle diameter of 0.07 μm or more in the curable composition (α2-1) was 99.9 particles/mL. Accordingly, the number of particles from the curable composition (α1-1) and the curable composition (α2-1) on the silicon wafer is less than 1, hence the breakage of the mold due to the particles can be suppressed. In addition, a pattern defect of the cured product pattern to be obtained can be suppressed.

Example 5

As in Example 4, the surface tension of the curable composition (α1'-2) that is the components of the curable composition (α1-2) except the solvent component (D) arranged in the lower layer is higher than the surface tension of the curable composition (α2-1) dispensed dropwise in the upper layer, and hence the Marangoni effect is expressed and the expansion (prespread) of the droplets of the curable composition (α2-1) is quick.

In addition, the number concentration (average) of particles each having a particle diameter of 0.07 μm or more in the curable composition (α1-2) was 36.5 particles/mL and the number concentration (average) of particles each having a particle diameter of 0.07 μm or more in the curable composition (α2-1) was 99.9 particles/mL. Accordingly, the number of particles from the curable composition (α1-2) and the curable composition (α2-1) on the silicon wafer is less than 1, hence the breakage of the mold due to the particles can be suppressed. In addition, a pattern defect of the cured product pattern to be obtained can be suppressed.

Comparative Example 4

As in Example 4, the surface tension of the curable composition (α1'-1β) that is the components of the curable composition (α1-1β) except the solvent component (D) arranged in the lower layer is higher than the surface tension of the curable composition (α2-1β) dispensed dropwise in the upper layer, and hence the Marangoni effect is expressed and the expansion (prespread) of the droplets of the curable composition (α2-1β) is quick.

In addition, the number concentration (average) of particles each having a particle diameter of 0.07 μm or more in the curable composition (α1-1β) was more than 9600 particles/mL and the number concentration (average) of particles each having a particle diameter of 0.07 μm or more in the curable composition (α2-1β) was 616 particles/mL. Accordingly, the number of particles from the curable composition (α1-1β) and the curable composition (α2-1β) on the silicon wafer is 1 or more, hence the breakage of the mold due to the particles tends to occur in comparison to the examples. In addition, a pattern defect of the cured product pattern to be obtained tends to occur in comparison to the examples.

<Measurement of Surface Tension of Curable Composition (α1') that is the Components of the Curable Composition (α1) Except the Solvent Component (D) and Curable Composition (α2)>

The surface tensions of a composition of the curable composition (α1') that is the components of the curable composition (α1) except the solvent component (D) and a curable composition (α2) at 25° C. were measured with an automatic surface tension meter DY-300 (manufactured by Kyowa Interface Science Co., Ltd.) by a plate method involving using a platinum plate. The measurement was performed under the conditions of a number of times of the measurement of 5 and a prewet immersion distance of the platinum plate of 0.35 mm. The first measured value was excluded, and the average of the second to fifth measured values was defined as the surface tension.

The results of Examples and Comparative Examples are collectively shown in Table 1 and Table 2.

TABLE 1

Curable Compositions Prepared in Examples 1 to 3 and Comparative Examples 1 to 3

| | Curable composition (α) | Particle removing step | Surface tension (mN/m) | Number concentration of particles each having particle diameter of 0.07 μm or more in liquid (particles/mL) |
|---|---|---|---|---|
| Example 1 | α1-1 | Present (circulation filtration) | 34 | 21.5 |
| Example 2 | α1-2 | Present (circulation filtration) | 37 | 36.5 |
| Example 3 | α2-1 | Present (circulation filtration) | 33 | 99.9 |
| Comparative Example 1 | α1-1β | Absent | 34 | >9,600 |
| Comparative Example 2 | α1-2β | Absent | 37 | >9,600 |
| Comparative Example 3 | α2-1β | Present (pressure filtration) | 33 | 616 |

TABLE 2

Result of Photo-nanoimprint in Examples 4 and 5 and Comparative Example 4

| | Curable composition (α) | Surface tension difference (α1 − α2) (mN/m) | Number concentration of particles each having particle diameter of 0.07 μm or more in liquid (particles/mL) Curable composition | | Yield (through-put) |
|---|---|---|---|---|---|
| | | | α1 | α2 | |
| Example 4 | α1-1/α2-1 | 1 | 21.5 | 99.9 | good |
| Example 5 | α1-2/α2-1 | 4 | 36.5 | 99.9 | good |
| Comparative Example 4 | α1-1β/α2-1β | 1 | >9,600 | 616 | bad |

First, as can be seen from comparison between Example 1 and Example 2, and Comparative Example 1 and Comparative Example 2, the use of the circulation filtration step can effectively reduce the number concentration of the particles in the curable composition (α1). In Example 1 and Example 2, the number concentrations of the particles each having a particle diameter of 0.07 μm or more in the curable compositions (α1-1 and α1-2) were 21.5 particles/mL and 36.5 particles/mL, respectively, and hence both the concentrations were less than 2,021 particles/mL.

It is assumed that when the curable composition (α1) having a number concentration of the particles each having a particle diameter of 0.07 μm or more of less than 2,021 particles/mL is used as described above, the occurrence of the breakage of a mold due to the particles can be suppressed. In addition, it is assumed that a pattern defect of a cured product pattern to be obtained can be suppressed. It is assumed that as a result of the foregoing, a reduction in yield of the SST-NIL process can be suppressed.

In addition, as can be seen from comparison between Example 3 and Comparative Example 3, the use of the circulation filtration step can effectively reduce the number concentration of the particles in the curable composition (α2). In Example 3, the number concentration of the particles each having a particle diameter of 0.07 μm or more in the curable composition (α2-1) was 99.9 particles/mL, and hence the concentration was less than 471 particles/mL.

It is assumed that when the curable composition (α2) having a number concentration of the particles each having a particle diameter of 0.07 μm or more of less than 471 particles/mL is used as described above, the occurrence of the breakage of the mold due to the particles can be suppressed. In addition, it is assumed that the pattern defect of the cured product pattern to be obtained can be suppressed. It is assumed that as a result of the foregoing, the reduction in yield of the SST-NIL process can be suppressed.

Next, in the SST-NIL process, in the mold contacting step (3), the mixture layer obtained by partially mixing the curable composition (α1') that is the components of the curable composition (α1) except the component (D) serving as a solvent and the curable composition (α2) is brought into contact with the mold. Therefore, it is assumed that when both the curable composition (α1) having a number concentration of the particles each having a particle diameter of 0.07 μm or more of less than 2,021 particles/mL, and the curable composition (α2) having a number concentration of the particles each having a particle diameter of 0.07 μm or more of less than 471 particles/mL are used in combination like Example 4 and Example 5, the occurrence of the breakage of the mold due to the particles can be further suppressed. In addition, it is assumed that the pattern defect of the cured product pattern to be obtained can be further suppressed. It is assumed that as a result of the foregoing, the reduction in yield of the SST-NIL process can be further suppressed.

Further, as described in the foregoing, it can be assumed that in the case where such a mold with an L/S pattern that the width of a groove portion of the mold is S (nm) is used, the mold breaks when the particle diameter D (nm) of a particle is more than 3S (nm) (D>3S). That is, in the case of a particle having a particle diameter of 0.07 μm or more, a mold pattern that does not break may be a pattern having a space width of one third or more of the particle diameter, in other words, 23.3 nm or more. That is, it is assumed that the curable composition of each of Examples can suppress a reduction in yield particularly in the SST-NIL process involving using a mold having a pattern having a minimum space width of 23.3 nm or more.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of producing a cured product pattern, comprising:
   arranging a layer of a liquid film on a substrate using a curable composition (α1) such that the liquid film is of a curable composition (α1'), which is components of the curable composition (α1) except a component serving as a solvent;

applying droplets of a curable composition (α2) discretely to the layer such that the curable composition (α2) in the droplets spreads on the liquid film in a substrate surface direction;

bringing a mixture layer obtained by partially mixing the curable composition (α1') and the curable composition (α2) into contact with a mold having a pattern;

irradiating the mixture layer with light from outside of the mold to cure the mixture layer; and releasing the mold from the mixture layer after the curing, wherein the curable composition (α1) has a number concentration of particles each having a particle diameter of 0.07 μm or more of 21.5 particles/mL to less than 2,021 particles/mL, and wherein the curable composition (α1') has a surface tension larger than that of the curable composition (α2).

2. The method according to claim 1, wherein the curable composition (α2) has a number concentration of particles each having a particle diameter of 0.07 μm or more of less than 471 particles/mL.

3. The method according to claim 1, wherein the substrate has an adhesion layer formed on an upper surface thereof.

4. The method according to claim 1, wherein:
the mold comprises a mold having a groove/land pattern formed on a surface thereof;
a width of a groove portion of the groove/land pattern is 4 nm to less than 30 nm; and
an aspect ratio (H/L) of a height H of the pattern of the mold with respect to a width L of a land portion of the mold is 1 to 10.

5. The method according to claim 1, further comprising, between the applying of the droplets of the curable composition (α2) and the bringing of the mixture layer into contact with the mold, performing an alignment between the substrate and the mold.

6. The method according to claim 1, wherein the applying of the droplets of the curable composition (α2) to the releasing of the mold from the mixture layer after the curing are repeated in different regions on the substrate a plurality of times.

7. The method according to claim 1, wherein the bringing of the mixture layer into contact with the mold is performed under an atmosphere containing a condensable gas.

8. A method of producing an optical component, comprising a step of obtaining a cured product pattern by the method of claim 1.

9. A method of producing a circuit board, comprising a step of obtaining a cured product pattern by the method of claim 1.

10. A method of producing a quartz mold replica, comprising a step of obtaining a cured product pattern by the method of claim 1.

11. A method for producing a cured product on a substrate, comprising:
applying droplets of a curable composition (α2) discretely on the substrate such that the curable composition (α2) in the droplets spreads on a liquid film in a substrate surface direction, in a state where a layer comprising the liquid film of a curable composition (α1'), which is components of a curable composition (α1) except a component serving as a solvent, is arranged on the substrate;
curing the curable composition (α1') and the curable composition (α2),
wherein in the curable composition (α1), a number concentration of particles having a particle diameter of 0.07 μm or more is 21.5 particles/mL to less than 2,021 particles/mL, and
wherein the curable composition (α1') has a surface tension larger than that of the curable composition (α2).

* * * * *